US012652780B2

(12) United States Patent
Sivertsen

(10) Patent No.: US 12,652,780 B2
(45) Date of Patent: Jun. 9, 2026

(54) ENCLOSED LIQUID COOLING SYSTEM

(71) Applicant: LiquaCool IP LLC, Lakeside, MT (US)

(72) Inventor: Clas Sivertsen, Kristiansund (NO)

(73) Assignee: LIQUACOOL IP LLC, Lakeside, MT (US)

( * ) Notice: Subject to any disclaimer, the term of this patent is extended or adjusted under 35 U.S.C. 154(b) by 0 days.

(21) Appl. No.: 19/047,555

(22) Filed: Feb. 6, 2025

(65) Prior Publication Data

US 2026/0101475 A1 Apr. 9, 2026

(30) Foreign Application Priority Data

Oct. 6, 2024 (EP) ..................................... 24204865

(51) Int. Cl.
*H05K 7/20* (2006.01)
*H05K 1/02* (2006.01)
*H05K 5/06* (2006.01)

(52) U.S. Cl.
CPC ........... *H05K 7/203* (2013.01); *H05K 1/0203* (2013.01); *H05K 5/061* (2013.01); *H05K 7/20327* (2013.01); *H05K 7/20381* (2013.01); *H05K 7/20409* (2013.01); *H05K 2201/064* (2013.01)

(58) Field of Classification Search
CPC ......... H01L 23/473; H01L 2924/16152; H01L 23/4006; H01L 23/4735; H05K 7/20254; H05K 1/0203; H05K 7/20236; H05K 7/203; H05K 7/20927; H05K 7/20509; H05K 5/061; G06F 1/20; G06F 2200/201

USPC ......................................................... 361/700
See application file for complete search history.

(56) References Cited

U.S. PATENT DOCUMENTS

| | | | |
|---|---|---|---|
| 4,727,455 A | 2/1988 | Neidig et al. | |
| 4,839,774 A | 6/1989 | Hamburgen | |
| 5,109,318 A | * 4/1992 | Funari ................ | H05K 7/20509 |
| | | | 257/713 |
| 5,305,184 A | 4/1994 | Andresen et al. | |
| 5,373,417 A | 12/1994 | Barrett | |
| 5,880,524 A | 3/1999 | Xie | |
| 5,990,418 A | 11/1999 | Bivona et al. | |
| 6,052,284 A | 4/2000 | Suga et al. | |

(Continued)

FOREIGN PATENT DOCUMENTS

| | | | |
|---|---|---|---|
| CN | 205987529 U | * | 2/2017 |
| CN | 116913872 A | | 10/2023 |

(Continued)

OTHER PUBLICATIONS

CN 205987529 U Original (Year: 2016).*

(Continued)

*Primary Examiner* — Mandeep S Buttar
(74) *Attorney, Agent, or Firm* — Nicholson De Vos Webster & Elliott LLP; Judith Szepesi

(57) ABSTRACT

A liquid cooling system comprising a printed circuit board, a gasket seated on a top side of the printed circuit board gasket encircling one or more components on the printed circuit board, an enclosure on the gasket and fastened against the printed circuit board to form a sealed chamber, and a transfer liquid within the sealed chamber contacting one or more components mounted on the printed circuit board to provide cooling for the one or more components.

20 Claims, 33 Drawing Sheets

310 Enclosure
315 Rubber Seal
320 Threaded Hole
325 Solder Mask
330 Copper Layer With traces
335 PCB Dielectric
340 Mounting screw
360 Single Solid Silkscreen

(56) References Cited

U.S. PATENT DOCUMENTS

| | | | |
|---|---|---|---|
| 6,114,048 A | 9/2000 | Jech et al. | |
| 6,175,501 B1 | 1/2001 | Bortolini et al. | |
| 6,208,511 B1 | 3/2001 | Bortolini et al. | |
| 6,304,447 B1 * | 10/2001 | Bortolini | H05K 7/20236 |
| | | | 257/714 |
| 6,665,187 B1 | 12/2003 | Alcoe et al. | |
| 7,124,806 B1 | 10/2006 | Wang et al. | |
| 7,433,188 B2 | 10/2008 | Miller | |
| 7,538,425 B2 * | 5/2009 | Myers | H10D 62/117 |
| | | | 257/730 |
| 10,542,640 B1 | 1/2020 | Leigh et al. | |
| 10,687,441 B2 | 6/2020 | Parnes et al. | |
| 11,365,906 B2 | 6/2022 | Eadelson | |
| 11,647,607 B2 | 5/2023 | Dogruoz et al. | |
| 11,705,437 B1 | 7/2023 | Deng et al. | |
| 11,778,783 B2 | 10/2023 | Eadelson | |
| 12,018,893 B2 | 6/2024 | Eadelson | |
| 12,022,639 B2 | 6/2024 | Liu et al. | |
| 12,245,360 B2 | 3/2025 | Mohr et al. | |
| 2001/0023759 A1 | 9/2001 | Katsui | |
| 2002/0062648 A1 | 5/2002 | Ghoshal | |
| 2003/0123225 A1 | 7/2003 | Miller | |
| 2003/0184972 A1 | 10/2003 | Saeki et al. | |
| 2006/0007655 A1 * | 1/2006 | Symons | H01L 23/473 |
| | | | 257/E23.098 |
| 2006/0034052 A1 | 2/2006 | Chang et al. | |
| 2007/0109739 A1 | 5/2007 | Stefanoski | |
| 2007/0132479 A1 | 6/2007 | Fenk | |
| 2008/0000087 A1 | 1/2008 | Kuczynski et al. | |
| 2009/0057881 A1 * | 3/2009 | Arana | H01L 25/0657 |
| | | | 257/E21.511 |
| 2010/0147492 A1 | 6/2010 | Conry | |
| 2011/0002102 A1 | 1/2011 | Brok et al. | |
| 2011/0134610 A1 | 6/2011 | Baur et al. | |
| 2012/0063094 A1 | 3/2012 | Gaynes et al. | |
| 2012/0085520 A1 | 4/2012 | Pfaffinger | |
| 2012/0099274 A1 | 4/2012 | Winter | |
| 2012/0111553 A1 | 5/2012 | Tsoi et al. | |
| 2012/0127661 A1 | 5/2012 | Brok et al. | |
| 2012/0133051 A1 | 5/2012 | Knickerbocker et al. | |
| 2012/0228779 A1 | 9/2012 | King, Jr. et al. | |
| 2014/0124174 A1 | 5/2014 | Campbell et al. | |
| 2014/0318169 A1 | 10/2014 | Wits et al. | |
| 2014/0362552 A1 | 12/2014 | Murayama et al. | |
| 2015/0098200 A1 * | 4/2015 | Spangberg | H05K 7/1427 |
| | | | 361/752 |
| 2015/0109735 A1 | 4/2015 | Campbell et al. | |
| 2015/0131224 A1 | 5/2015 | Barina et al. | |
| 2015/0234437 A1 | 8/2015 | Gallina et al. | |
| 2016/0020160 A1 | 1/2016 | Buvid et al. | |
| 2016/0073548 A1 | 3/2016 | Wei et al. | |
| 2016/0081178 A1 * | 3/2016 | D'Onofrio | H05K 1/0209 |
| | | | 361/699 |
| 2017/0295670 A1 | 10/2017 | Campbell et al. | |
| 2018/0090417 A1 | 3/2018 | Gutala et al. | |
| 2018/0157296 A1 | 6/2018 | Aoki et al. | |
| 2018/0288906 A1 | 10/2018 | Hopton et al. | |
| 2019/0269004 A1 | 8/2019 | Mitsui | |
| 2020/0315059 A1 | 10/2020 | Gao | |
| 2021/0064107 A1 | 3/2021 | Bender et al. | |
| 2021/0087967 A1 | 3/2021 | Louco et al. | |
| 2021/0130970 A1 | 5/2021 | Desalvo et al. | |
| 2021/0134646 A1 | 5/2021 | Or-Bach et al. | |
| 2021/0321526 A1 * | 10/2021 | Kulkarni | H05K 5/06 |
| 2022/0117080 A1 | 4/2022 | Geng et al. | |
| 2022/0187023 A1 | 6/2022 | Kang | |
| 2022/0230937 A1 | 7/2022 | Malouin et al. | |
| 2022/0316764 A1 | 10/2022 | Eadelson | |
| 2022/0338375 A1 | 10/2022 | Mizerak et al. | |
| 2022/0341860 A1 | 10/2022 | Fitch et al. | |
| 2022/0354011 A1 | 11/2022 | Hadwan et al. | |
| 2022/0354026 A1 | 11/2022 | Kelley et al. | |
| 2023/0317555 A1 | 10/2023 | Yangyang et al. | |
| 2024/0038632 A1 | 2/2024 | Prajuckamol et al. | |
| 2024/0057246 A1 | 2/2024 | Gupta et al. | |
| 2024/0147676 A1 | 5/2024 | Takata | |
| 2025/0071938 A1 | 2/2025 | Yang et al. | |

FOREIGN PATENT DOCUMENTS

| | | |
|---|---|---|
| CN | 220122869 U | 12/2023 |
| CN | 117946621 A | 4/2024 |
| DE | 202010014106 U1 | 12/2010 |
| EP | 0191419 A2 | 8/1986 |
| EP | 0709884 A2 | 5/1996 |
| EP | 2769601 A1 | 8/2014 |
| EP | 3229571 A2 | 10/2017 |
| EP | 3629691 A1 | 4/2020 |
| IT | UB20155887 A1 | 5/2017 |
| JP | 57-104538 U | 6/1982 |
| JP | 01-230971 A | 9/1989 |
| JP | 03-067446 U | 7/1991 |
| JP | 04-129255 A | 4/1992 |
| JP | H1145967 A | 2/1999 |
| JP | 2002-043488 A | 2/2002 |
| JP | 2023-004440 A | 1/2023 |
| KR | 10-0369717 B1 | 6/2003 |
| KR | 10-1741079 B1 | 5/2017 |
| TW | M648455 U | 11/2023 |
| WO | 2007/046221 A1 | 4/2007 |
| WO | 2018/025016 A1 | 2/2018 |
| WO | 2024/243146 A1 | 11/2024 |

OTHER PUBLICATIONS

Middelhuis, M. et al., "Analysis and experimental validation of a pumped two-phase loop for multi-component electronics cooling," Heat Mass Transfer, vol. 60, Nov. 15, 2023, pp. 305-327.

Terpstra, J. et al., "Improving Thermal Contact Conductance from Electronics Board to Rack Infrastructure," 24rd International Workshop on Thermal Investigations of ICs and Systems (THERMINIC), Stockholm, Sweden, Sep. 2018, pp. 1-6.

Wits, W. et al., "Experimental Performance of a 3D-Printed Hybrid Heat Pipe-Thermosyphon for Cooling of Power Electronics," 24rd International Workshop on Thermal Investigations of ICs and Systems (THERMINIC), Stockholm, Sweden, Sep. 2018, pp. 1-6.

Zwier, M.P., "Modelling and experimental investigation of a thermally driven self-oscillating pump," Applied Thermal Engineering, vol. 126, Nov. 5, 2017, pp. 1126-1133.

Extended European Search Report and Search Opinion , EP App. No. 24204865.0, Apr. 8, 2025, 7 pages.

International Search Report and Written Opinion, PCT App. No. PCT/US25/49530, Dec. 30, 2025, 12 pages.

First Office Action, JP App. No. 2025-027743, Mar. 11, 2026, 15 pages (08 pages of English Translation and 07 pages of Original Document).

* cited by examiner

210 External Optional Fan

220 Enclosure, Top Component

230 Top Rubber Seal (gasket)

240 Printed Circuit Board (PCB) Assembly (PCBA) With Components

250 Bottom Rubber Seal (gasket)

260 Enclosure, Bottom Component

270 Screws

230 Rubber Seal (gasket)

240 Printed Circuit Board (PCB) Assembly (PCBA) With Components

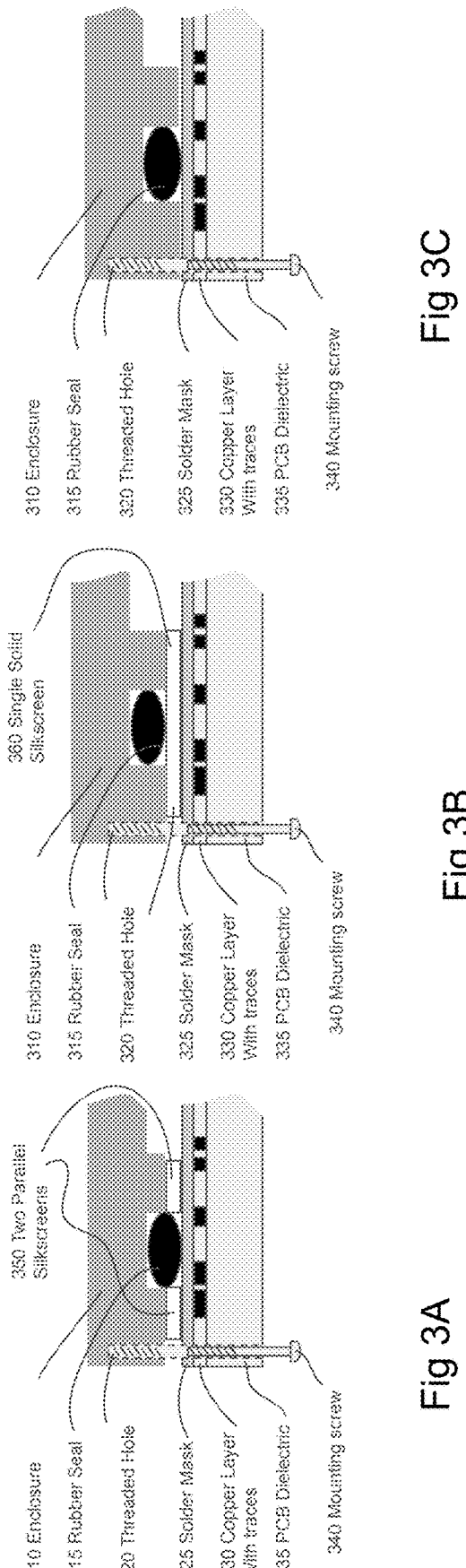

310 Enclosure

315 Rubber Seal

320 Threaded Hole

325 Solder Mask

330 Copper Layer
With traces

335 PCB Dielectric

340 Mounting screw

360 Single Solid
Silkscreen

Fig 3C

310 Enclosure

315 Rubber Seal

320 Threaded Hole

325 Solder Mask

330 Copper Layer
With traces

335 PCB Dielectric

340 Mounting screw

Fig 3B

350 Two Parallel
Silkscreens

310 Enclosure

315 Rubber Seal

320 Threaded Hole

325 Solder Mask

330 Copper Layer
With traces

335 PCB Dielectric

340 Mounting screw

Fig 3A

410 Enclosure, Top Component

430 Rubber Seal Top (gasket)

440 Printed Circuit Board (PCB) Assembly (PCBA) With Components

435 Rubber Seal bottom (gasket)

420 Enclosure, Bottom Component

450 Liquid Flow-Holes in the PCB

460 Liquid Filled Chamber

460 Liquid Filled Chamber

470 Fins

570 Threaded Screw Holes

540 Protection cavity for IO Ports

530 Seating Groove for the Gasket

520 Liquid Chamber

525 Protection cavity for connectors

560 Open Screw Holes

925 Rubber Gasket Top

930 Outer Liquid Flow Holes in PCB

935 Inter-Chip Liquid Flow-Holes in PCB, Under the BGA Chip

910 PCB

927 Rubber Gasket Bottom

920 BGA Chip

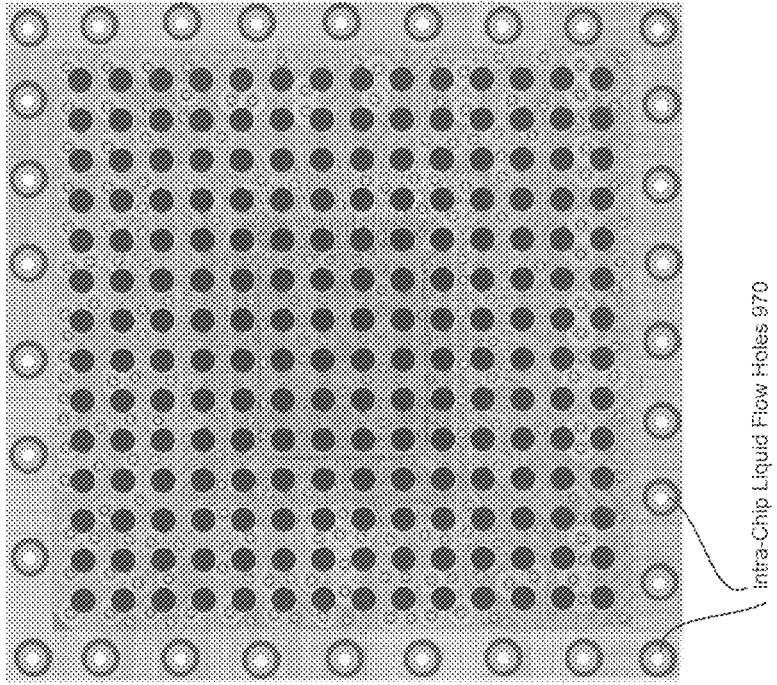
Intra-Chip Liquid Flow Holes 970
Fig 9F
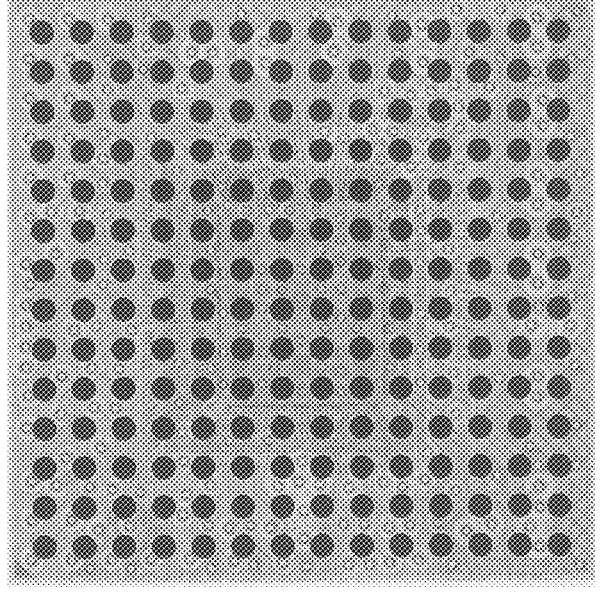
X-RAY of a typical BGA chip Intra-Chip Flow-Holes for Liquid Cooling 1010

Die 1050    Solder Bump 1055

Via 1035

IC Substrate 1040

Solder Balls 1045

Plating to increase thermal conductivity to substrate 1015

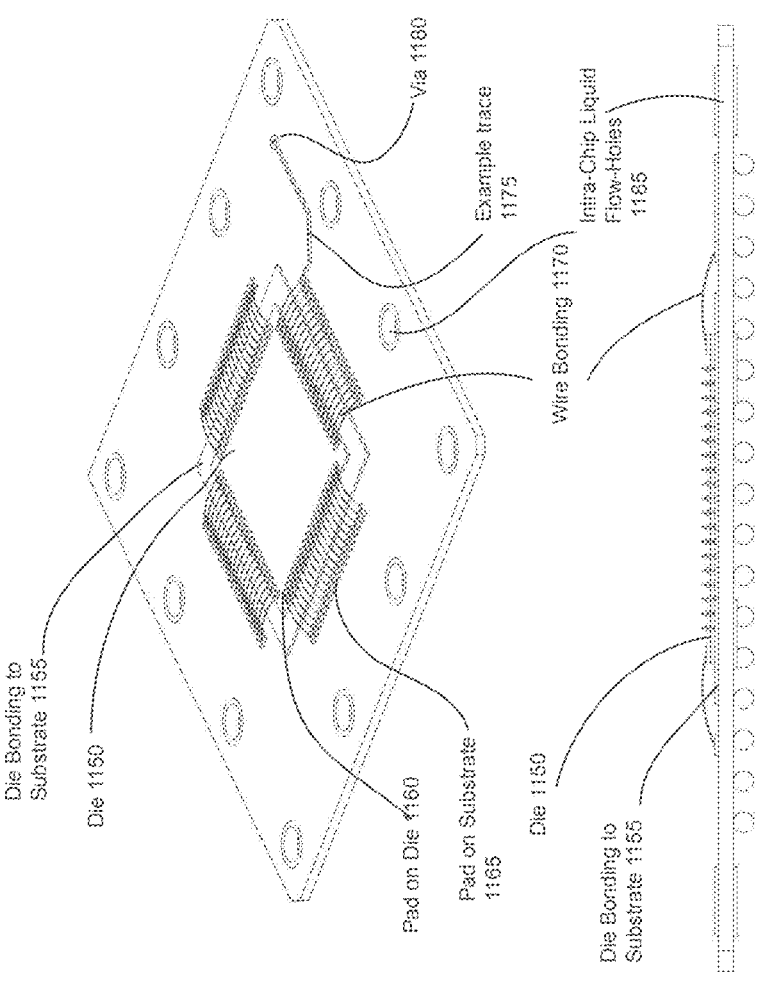
Via 1180
Example trace
1175
Intra-Chip Liquid
Flow-Holes
1185
Wire Bonding 1170
Die Bonding to
Substrate 1155
Die 1150
Pad on Die 1160
Pad on Substrate
1165
Die 1150
Die Bonding to
Substrate 1155
Fig 11B
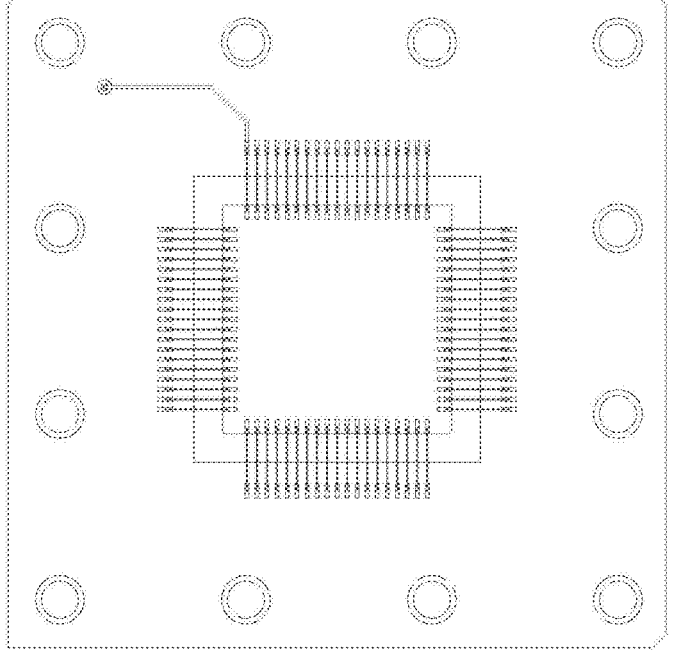

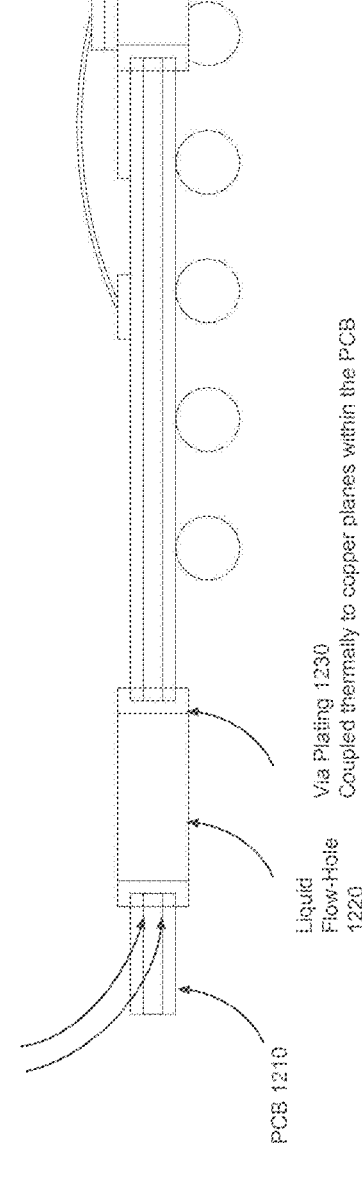
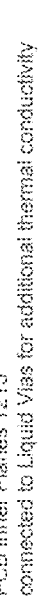
Fig 12

Thermal Sensor and Controller for the Propeller Motor 1350

PCB 1310

Liquid Via 1340

Liquid Driver 1360
Here Fan Motor

Gasket 1320

Fan Motor 1360

Mounting Pins 1380

Propeller 1365

Vibration Motor 1370

Aluminum Fingers 1420

Enclosure with Aluminum Fingers 1410

ENCLOSED LIQUID COOLING SYSTEM

FIELD

The present application relates to thermal management systems, specifically to a liquid cooling enclosure integrated with a printed circuit board (PCB) to dissipate heat generated by electronic components.

BACKGROUND

Integrated circuits (ICs) such as central processing units (CPUs), systems on a chip (SOCs), graphics processors (GPUs), tensor processing units (TPUs), neural processing units (NPUs), field-programmable gate arrays (FPGAs), and application-specific integrated circuits (ASICs), power transistors, DC-DC converters, power controllers with integrated switching transistors, triacs, thyristors, diode bridge rectifiers, insulated-gate bipolar transistors (IGBTs), voltage regulators, motor drivers, power factor correction (PFC) circuits, load switches, and others produce heat during operation. These components must be adequately cooled to maintain optimal performance and prevent failure.

In the prior art, various heat dissipation methods have been employed to absorb and remove heat from the ICs and redistribute it away from the hardware.

Traditionally, cooling methods have relied on a combination of heat sinks and fans, where air is moved across the heatsink to dissipate heat. However, such methods are often insufficient for managing the thermal demands of modern, high-performance components.

One prior art solution is liquid cooling. In this system, rather than air, a liquid such as water or a specialized dielectric fluid circulates to remove heat. The system generally consists of a baseplate connected to the metal lid of a CPU via thermal paste. The baseplate forms part of a waterblock that is filled with coolant. As the coolant absorbs heat from the baseplate, it is transferred through the waterblock and then routed to a radiator. At the radiator, the liquid is exposed to air for cooling, with fans often used to accelerate heat removal. The coolant then re-enters the waterblock, completing the cycle.

Semiconductor components exhibit a characteristic known as thermal runaway; wherein power consumption increases exponentially with rising temperature. As the die temperature rises, the power required to perform the same computational operations increases, exacerbating the thermal load. Without efficient heat removal, this thermal runaway can escalate, leading to critical temperature levels in semiconductor systems.

Traditionally, cooling semiconductor dies involve two approaches. The first involves heat dissipation through the top surface of the die, with thermal paste bridging the die to a metal heatsink, which is cooled by air or liquid. The second approach leverages ground pads connected to the package via gold wires, which are linked to the printed circuit board (PCB). This allows some heat to be transferred from the die through pins or balls to the PCB. Though relatively inefficient, even these incremental contributions help alleviate heat in high-performance systems.

The combined effect of these traditional cooling methods is in line with the principle of superposition, where every thermal gradient—any interface or material transition where temperature differences exist—contributes to reducing the internal temperature of the semiconductor die. Nevertheless, even with state-of-the-art conductive cooling techniques, high-performance semiconductor devices often exhibit internal die temperatures exceeding 100° C. in ambient environments of 30° C.

To further manage die temperature, many systems incorporate thermal sensors that monitor temperature levels and initiate throttling or other thermal management strategies when critical thresholds are approached.

While immersion cooling has been practiced for many years in the electronics industry, it presents several drawbacks because entire motherboards or subassemblies must be submerged in a liquid bath. In such configurations, interconnects, such as wires and cables, must exit the liquid, leading to complex and often cumbersome installations. Additionally, the need for large volumes of liquid makes the system expensive, prone to liquid loss through evaporation, and difficult to manage.

BRIEF DESCRIPTION OF THE FIGURES

The present invention is illustrated by way of example, and not by way of limitation, in the figures of the accompanying drawings and in which like reference numerals refer to similar elements and in which:

FIGS. 3A-3C are cross sections of different embodiments of the gasket and enclosure.

FIGS. 9A-9F are illustrations of cooling using the liquid cooling system.

FIGS. 11A-11B are illustrations of a flip-chip type packaging with liquid flow-holes.

FIG. 12 is an illustration of a cross-section of a chip, with a liquid flow-hole connected to the internal planes of the PCB.

DETAILED DESCRIPTION

Figure 1:
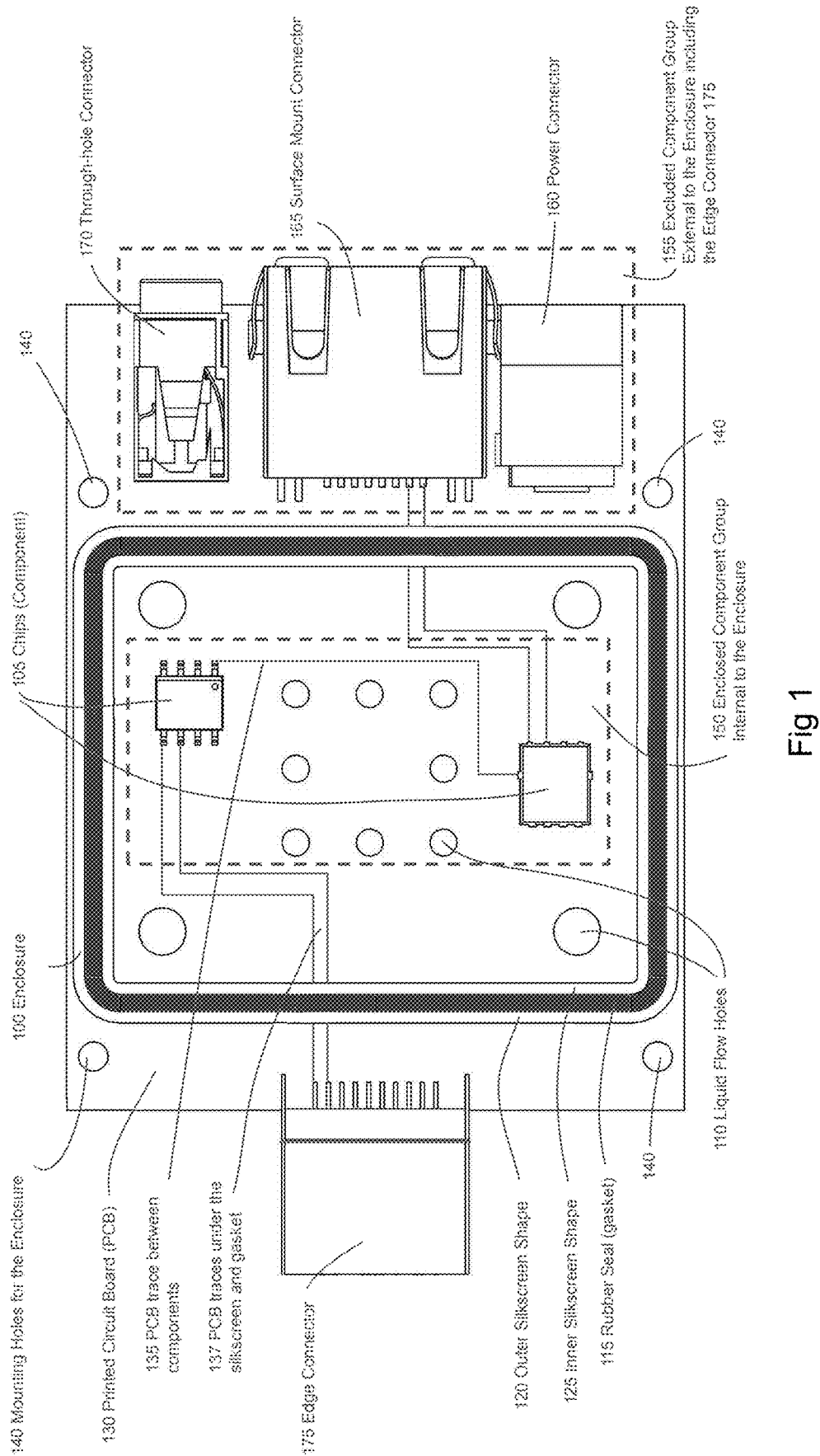
FIG. 1 is a top view of one exemplary configuration of the liquid cooling system.

The present invention describes a liquid cooling system which includes an enclosure coupled to a printed circuit board using a gasket. The enclosure is filled with a transfer liquid which has a high heat transfer coefficient but is not electrically conductive (i.e. is electrically insulating). The transfer liquid may be a single phase or a two-phase liquid. The system can provide board-level cooling, cooling one or more chips on a printed circuit board. In various embodiments, the system can provide inter-chip cooling, which provides improved cooling by including inter-chip liquid flow-holes underneath components, ensuring that the transfer liquid makes contact with the bottom portion of one or more components on the printed circuit board. In some embodiments, the system can provide intra-chip cooling with flow-holes through the integrated circuit packaging to allow flow of the transfer liquid closer to the heat source. Intra-chip cooling allows the transfer liquid to enter the circuit package. In some embodiments, the transfer liquid makes direct contact with the die within the integrated circuit package. Additionally, the enclosure can protect the components from radiation.

The system may be designed using an electronic design automation (EDA) tool which can design the enclosure for the liquid cooling system, as well as its positioning, size, and other configuration details. The EDA tool can be integrated into an existing EDA system, enabling the design of the printed circuit board layout taking into account the liquid cooling system, including liquid flow-holes, enclosed portions, positioning, and other factors. As used herein, a liquid flow-hole is a hole in a printed circuit board or a component package that a transfer liquid is able to enter.

The present system provides the advantages of immersion cooling but confines the cooling liquid only to a subset of the system. The subset of the system includes the components that require thermal management. The present system encloses the transfer fluid within a sealed system, ensuring that the transfer fluid does not leak or evaporate. The transfer fluid should not need replenishment over the product's lifetime.

The enclosed liquid cooling system significantly enhances the bottom-side cooling of semiconductor components, replacing the traditional inefficient methods of top-side cooling while simultaneously improving heat transfer from the bottom.

In various embodiments, the transfer liquid contacts the bottom of the chip, allowing direct liquid cooling of all sides of the die and effectively cooling the pins, balls, and the surface area under the chip. It also cools the PCB itself. Through strategically placed liquid flow-holes, it cools the internal planes of the PCB, allowing for more uniform heat dissipation throughout the system with fewer thermal gradients. Furthermore, the positioning of the liquid flow-holes provides a path for the transfer liquid to move around the interior of the chamber or enclosure, the movement increasing the transfer of heat from the components.

This approach provides a synergistic effect: as the internal temperature of the die decreases, its power consumption also decreases, creating a reverse thermal runaway effect. The reduced power consumption further lowers the temperature (or limits or prevents temperature increase), enhancing the overall energy efficiency of the system. Thus, the present system provides multiple technical benefits, enhanced efficiency, and improved performance. The system further increases durability, reliability, and stability because the components are kept at a more efficient operating temperature. A system operating at a given performance level will run at a lower temperature, reducing power consumption and increasing overall energy efficiency. A system designed for maximum performance can achieve higher outputs while consuming less power and maintaining thermal stability.

As semiconductor dies shrink in size and/or more dies are integrated onto a single chip, power density increases, and thus the heat generated in a smaller area increases. The enclosed liquid cooling system allows for more efficient heat transfer across systems that include multiple dies, chips, power delivery components, and the PCB itself, thus improving the overall power consumption, thermal management, and power density of the system.

In various embodiments, the present system includes thermal sensors to monitor the die temperature. Once the die reaches a critical temperature, in some embodiments, performance throttling is initiated to prevent further thermal runaway. The system reduces the workload on the die, stabilizing the temperature at an equilibrium point where maximum allowable performance is maintained without overheating the chip. In other cases, such as during overclocking, the performance of the die is intentionally increased beyond recommended levels. This deliberate overclocking results in increased power consumption and heat generation, necessitating careful monitoring and control to ensure that the temperature remains within safe operating limits.

Furthermore, as the demand for computing power continues to grow, so does the power consumption of data centers worldwide. By integrating enclosed liquid cooling technology within individual chips and compute nodes in data centers, overall power consumption can be reduced. This reduction in power requirements not only improves the efficiency of individual data centers but also contributes to reducing the global energy footprint required for computing power.

The following detailed description of the invention makes reference to the accompanying drawings in which like references indicate similar elements, showing by way of illustration various embodiments of practicing the invention. Description of these embodiments is in sufficient detail to enable those skilled in the art to practice the invention. One skilled in the art understands that the various embodiments may be utilized in alternate configurations, and that logical, mechanical, electrical, functional, and other changes may be made without departing from the scope of the present invention. The following detailed description is, therefore, not to be taken in a limiting sense, and the scope of the present invention is defined only by the appended claims.

FIG. 1 is a top view of one configuration of the liquid cooling system. The liquid cooling system includes an enclosure, also referred to as a chamber. The enclosure 100, visible only in part in FIG. 1, covers a portion of the printed circuit board 130, which includes chips (or components) 105 that produce heat. As will be explained, the enclosure acts with other components to define an enclosed volume that may be referred to as a chamber. The enclosure is generally attached using mounting holes 140. The system has a rubber seal or gasket 115, which is used to provide a seal between the printed circuit board 130 and the enclosure that is leakproof, e.g., a seal that the transfer liquid cannot pass through. The gasket is seated on the PCB, although there may not be any seating groove on the PCB. The enclosure is seated on the gasket. A seating groove may be provided on the enclosure to facilitate seating and location of the gasket on the PCB. In various embodiments, an outer silkscreen line 120 and an inner silkscreen line 125 provide the seating groove which defines the position for the gasket 115. The silkscreen lines provide positioning for the enclosure and are used to ensure the enclosure is leakproof. The use of the silkscreen lines 120, 125 also provides the ability to lead PCB traces 135 underneath the enclosure and gasket, as pass-through PCB traces 137, without creating gaps. The enclosure is filled with a transfer liquid, which is used to transfer the heat from the components 105 to a heat sink (not shown).

The transfer liquid flows in a convection pattern, moving heat from the chips 105 to the metal enclosure 100, which includes fins to disperse the heat. The liquid flow-holes 110 are dispersed in a pattern to optimize the movement of the heat from the chips to the outside of the enclosure. Hotter materials or gasses rise, creating a temperature differential between the heated transfer fluid and the cooler exterior of the enclosure which induces a flow of liquid within the enclosure. In various embodiments, the transfer liquid may be used in only one phase, meaning it remains in liquid form through the process. Here, the entire volume of the chamber is filled with the transfer liquid in liquid form. In another embodiment, the transfer liquid may transition between phases from liquid to gas in specific locations where it is heated above the boiling point and then turn back into liquid again as the gas flows into a region where it is cooled down below the boiling point. This may increase the convection level, because gas rises faster than heated liquid, due to the lower density.

Perfluorinated compounds (PFCs) and perfluorocarbons may be used as the transfer liquid. In one embodiment, 3M™ Corporation's Fluorinert™ Electronic Liquid may be used as the transfer liquid. One example of such a liquid that could be used is the FC-72, which has a boiling point (phase transition point between liquid and gas) of 56 degrees Celsius at atmospheric pressure. This means that a semiconductor embedded into this liquid that heats up to where its external surface temperature exceeds this boiling point of 56 degrees Celsius, if the liquid within the enclosure is at atmospheric pressure, will cause the liquid to boil (turn into gas) all around the semiconductor top, sides, and bottom surfaces, and the gas will then bubble up against the direction of gravity, causing it to flow away from the chip and cool down as it mixes with colder liquid, at the same time as new colder liquid flows into the surfaces surrounding the chip. At higher pressures, the conversion of the liquid into the gas phase occurs at higher temperatures. Other nonconductive liquids may also be used.

The enclosure is designed to cover the enclosed component group 150 which includes one or more heat producing components 105, and exclude external components 155, which may include edge connectors 175, through-hole connectors 170, surface mount connectors 165, and power connectors 160. In various embodiments, for double-sided enclosures, one or more liquid flow-holes 110 allow the liquid to circulate between the two sides of the printed circuit board.

The design may include more or fewer excluded components 155 or enclosed components 150. There may be a configuration which includes no excluded components, with the enclosure covering the entirety of one or both sides of the PCB. This configuration may be used for example with a PCB that uses a PCI (Peripheral Component Interconnect) express bus. In such a configuration, the PCB is designed to plug into a PC motherboard, and the PCB has no external components because all of the computational instructions go through the PCI express bus.

The system may not include the silkscreen lines or may include a single line over which the gasket is positioned. In a one-sided enclosure, there may not be liquid flow-holes, as the transfer liquid is not moving between the sides of the PCB.

Figures 2A, 2B:
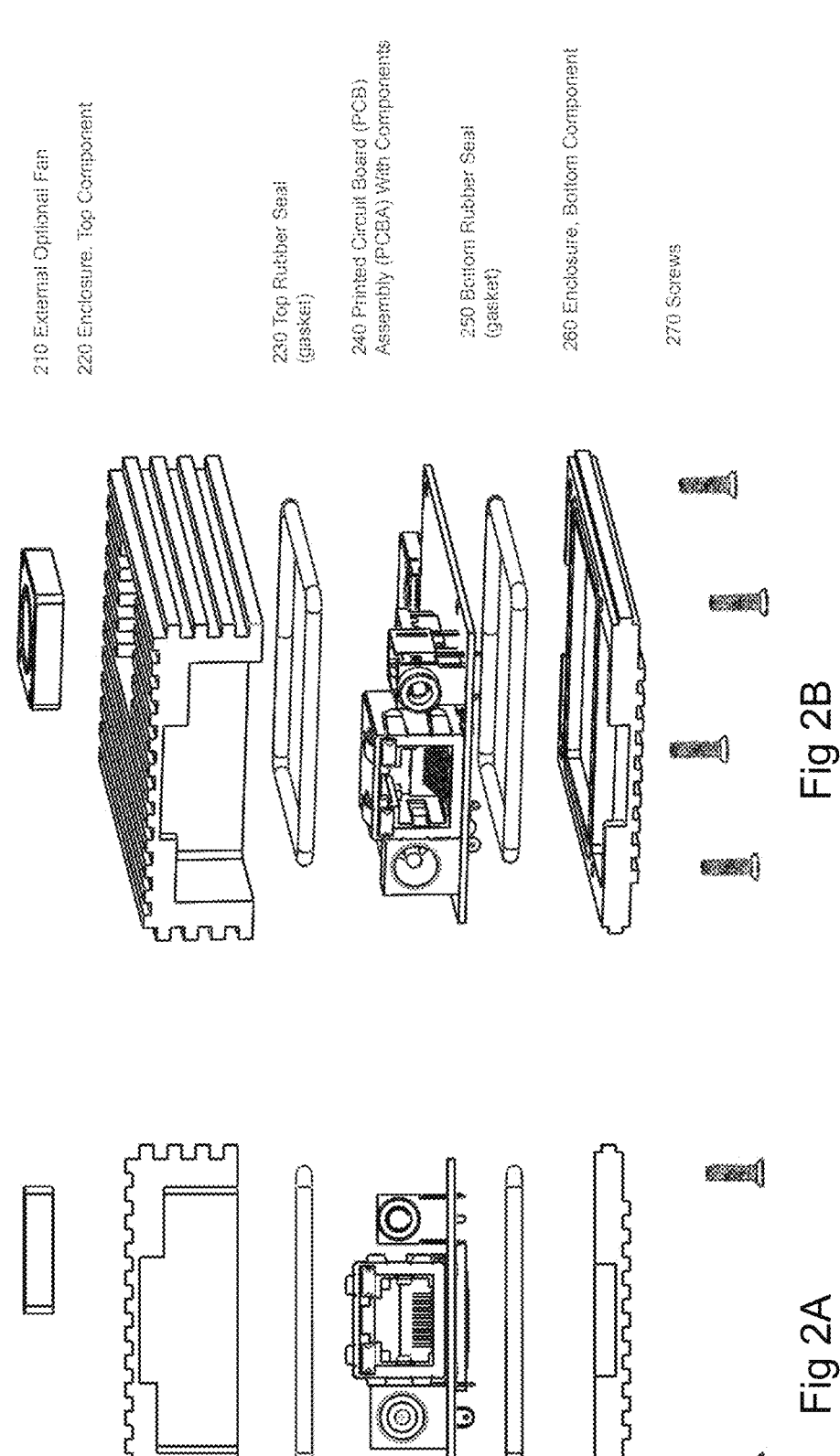
FIGS. 2A and 2B are exploded views of one exemplary configuration of the liquid cooling system.

FIGS. 2A and 2B are exploded views of an exemplary configuration of the liquid cooling system. The illustrated system provides an exploded front view 200 in FIG. 2A and an exploded perspective or isometric view in FIG. 2B of a dual-sided enclosure. The system shows the printed circuit board 240, with two rubber gaskets 230, 250, to which the top of the enclosure 220 and the bottom of the enclosure 260 are coupled. In various embodiments, screws 270 are used to attach the bottom of the chamber 260 to the top of the chamber 220, through mounting holes in the PCB 240. The screws may be oriented from the top and/or the bottom. The screws may terminate within the enclosure. The screws may be replaced by rivets, or other fasteners. The enclosures 220 and 260 are fastened against the PCB 240 by virtue of being fastened to each other. They are also fastened to the PCB, forming a leakproof enclosure.

The enclosure may be made of any highly heat conductive material. In various embodiments, the enclosure is made of aluminum, graphite, ceramic, and/or aluminum oxynitride. The enclosure may be made of another material which is heat conductive but not electrically conductive. The enclosure 220, 260 is in contact with the transfer fluid, and heat is moved from the transfer fluid to the enclosure, where it is dissipated into space. The top 220 and/or bottom 260 of the enclosure may have fins, pin-fins, or other components to better dissipate heat. An external optional fan 210 may also be used. In addition, or instead of using a fan and airflow to dissipate heat from the enclosure, an external liquid cooling may be used. Additional methods of dissipating the heat from the exterior of the enclosure may be used.

Figure 2C:
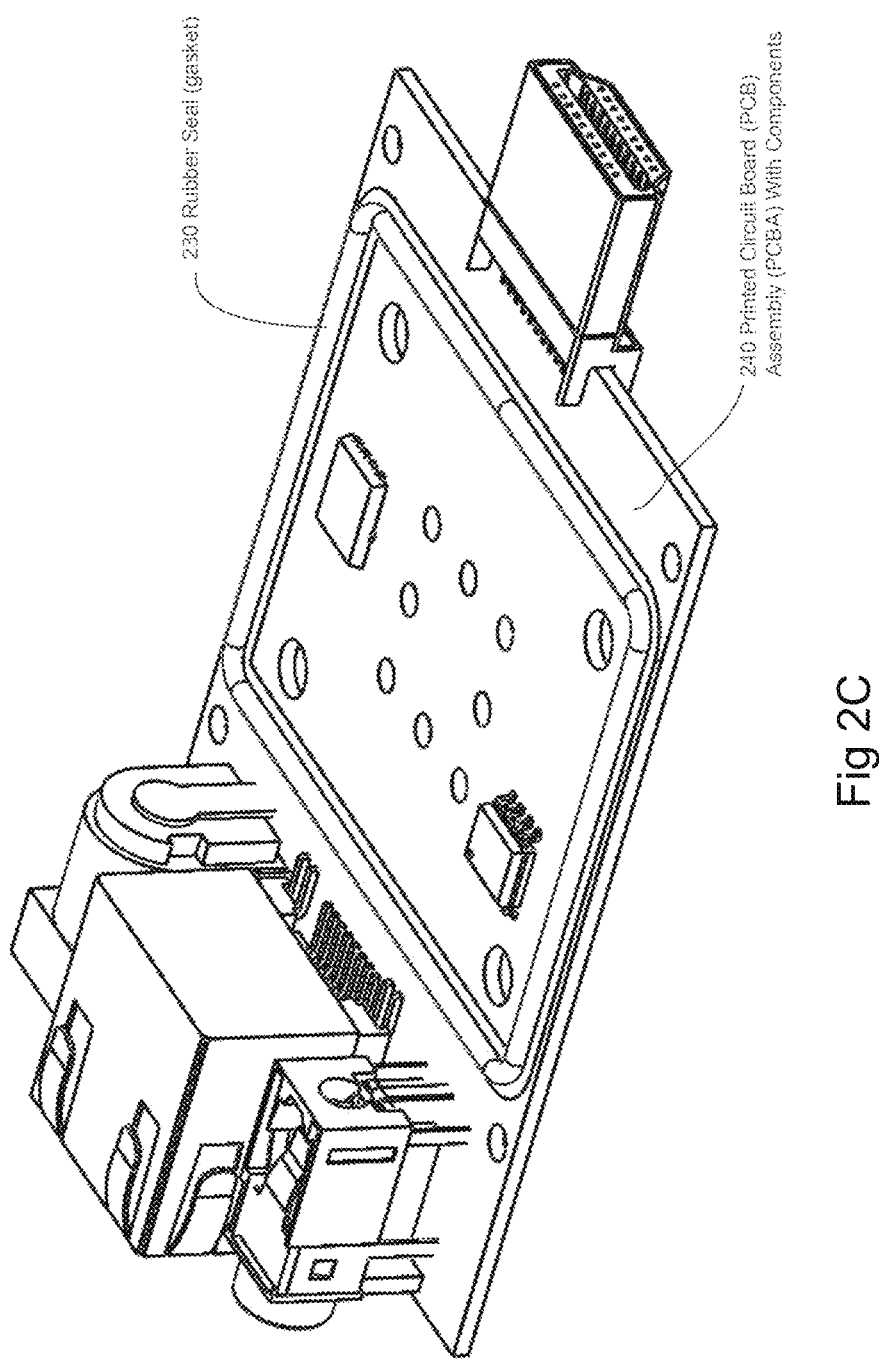
FIG. 2C is a view of one exemplary configuration of the printed circuit board including some components and the gasket.

The printed circuit board 240 and gasket 230 are shown in more detail in FIG. 2C, which illustrates a perspective view of the printed circuit board showing the gasket correctly positioned. As can be seen, some components are within the enclosure. These components are within the area defined by the gasket. The gasket encircles these components in that it surrounds them in the plane of the gasket. As can be seen, some other components are outside the enclosure (e.g., outside the rubber gasket defining the edge of the enclosure). These other components are used, in various embodiments, to couple the printed circuit board and its components to other components of a computer system. In addition to I/O (input/output) components, or instead of the I/O components, other components on the PCB may also be outside the enclosure.

FIGS. 3A-3C are cross sections of various embodiments of the gasket and enclosure. FIG. 3A illustrates the enclosure 310, which is coupled to a printed circuit board 345 using mounting screws 340. The two parallel silkscreens 350 define the position for the gasket or rubber seal 315. The enclosure 310 includes threaded holes 320 to receive the mounting screws 340. The gasket 315 and silkscreens 350 are on top of the solder mask 325, which overlays the copper layer with traces 330, on top of the PCB dielectric 335.

FIG. 3B illustrates a configuration in which a single silkscreen layer 360 is used, and the gasket 315 is positioned on top of the single solid silkscreen layer 360. The silkscreen provides positioning guidance as well as a smooth surface to ensure that the chamber defined by the enclosure 310 is leakproof.

FIG. 3C illustrates a configuration in which there is no silkscreen layer, with the gasket resting on top of the solder mask 325.

The gasket provides a seal between the chamber and the printed circuit board, to create a leakproof seal through which the liquid cannot pass. The seal may be referred to as leakproof or watertight, although the transfer liquid is not water, and the level of sealing required may be different at a given pressure differential for the transfer liquid compared to water. Furthermore, the leakproof seal also does not leak the transfer liquid in gas form. Gaskets maintain a seal between components, ensuring consistent and efficient performance under a variety of operating conditions. The gasket may be made of rubber, silicone, foam, or other sealing material. In various embodiments, the gasket provides EMI/RFI blocking. This may be done using a foam and wire mesh combination material, or another material. The gasket may alternatively be made of an electrically conductive material or may have an electrically conducting outer surface to help prevent EMI leakage. In another embodiment, the system may include a first gasket for sealing and a second gasket for electrical signal blocking.

Although FIGS. 3A-3C illustrate configurations of the printed circuit board, copper layer, and solder mask, one of skill in the art would understand that the configuration of these components is not essential to the invention. Rather, the system includes an enclosure forming a chamber which encloses all or a portion of a printed circuit board, using a gasket for leakproof sealing of the enclosure to the PCB. The actual configuration of the layers on the PCB is irrelevant to the design, as are the sizes and positions of the components on the PCB.

Figure 4:
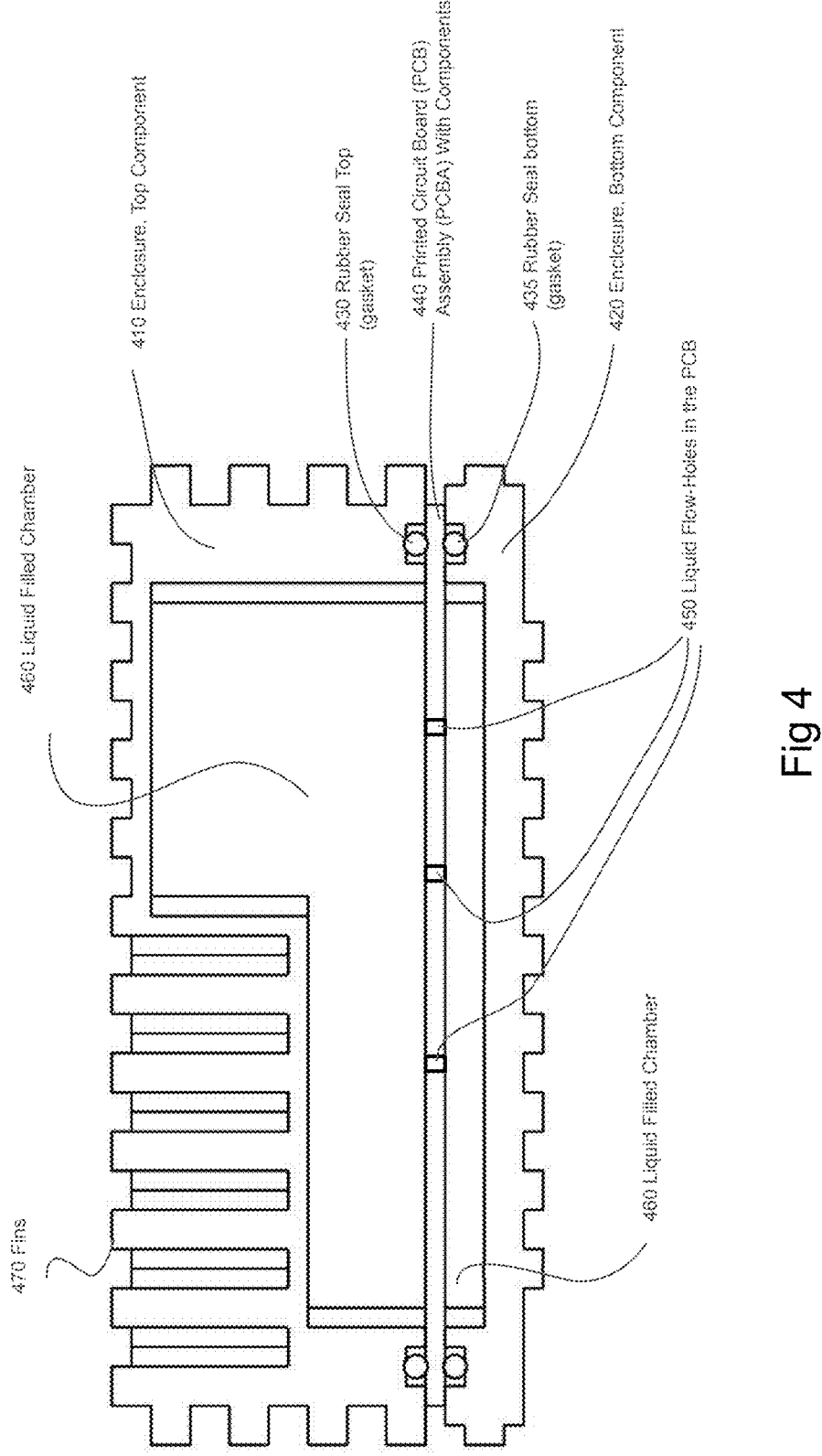
FIG. 4 is a cross-section view of one embodiment of the liquid cooling system.

FIG. 4 is a cross-section view of a liquid cooling system, with a top compartment and a bottom compartment. The system includes the top enclosure 410, coupled to the bottom enclosure 420. The enclosure 410, 420 is made of aluminum, an aluminum alloy, aluminum oxynitride (ALON), or another material that transfers heat.

The enclosure 410, 420 is coupled to a printed circuit board 440, which includes one or more heat-generating components (not shown). The printed circuit board 440 includes one or more holes 450 or liquid flow-holes, to allow the transfer liquid to circulate between the top and bottom portions of the chamber. The liquid filled chamber 460 is formed by the top and bottom portions of the enclosure. The enclosure components 410, 420 are coupled to the printed circuit board with a rubber seal or gasket 430, 435 to ensure that the transfer liquid cannot leak.

The shape of the chamber shown is defined by the shape of the enclosed components on the printed circuit board (not shown). In this configuration, one portion of the printed circuit board has taller components, and the other portion has shorter ones. The actual shape of the chamber may be modified to fit the configuration of the components on the printed circuit board.

The outside surface of the enclosures in various embodiments can include fins 470, pin-fins, and/or other protrusions to dissipate the heat transferred by the transfer liquid filling the chamber. The fins are sized to maximize the area of the cooling but are thick enough for manufacturability and to be stable and not deform, and still thin enough to maximize air flow and area. The system may use any configuration of the fin or protrusion shapes. One or more optional fans may be positioned on top of or in proximity to the chamber. Other ways of removing heat from the chamber may be used.

The liquid cooling system utilizes advanced materials and structural enhancements to maximize the efficiency of heat dissipation from the cooling chambers. In various embodiments, the enclosure is constructed from aluminum, chosen for its thermal conductivity and lightweight properties. In another embodiment, the enclosure is constructed from aluminum oxynitride, a transparent ceramic composite including aluminum, often called ALON(™). In one embodiment, the enclosure is constructed from graphite, ceramic, or a composite material.

To optimize heat dissipation, the enclosure may have thin walls, cooling ribs or fins, and/or surface treatments to increase its surface area. The walls of the enclosure may be as thin as 1 mm, providing rapid heat transfer without adding unnecessary weight. The enclosure may be designed with cooling ribs, pins, and/or fins on its exterior surface(s). These structural features increase the surface area of the enclosure, promoting greater heat exchange between the enclosure and the surrounding air.

One or more surface treatments may be applied to the interior or the exterior of the enclosure. The surface treatments may include sandblasting, powder coating, anodizing, emissive coatings, etc. The purpose of the surface treatments is to increase heat transmission.

The aluminum surface can be sandblasted to create a rougher texture, increasing the surface area available for heat dissipation. Sandblasting may be applied only to the exterior surface of the enclosure, while the interior surface is smooth to reduce turbulence in the transfer liquid.

A heat-resistant powder coating may be applied to the enclosure's exterior. This coating can be formulated to emit infrared radiation when heated, thereby improving heat transfer by radiating thermal energy into the surrounding air.

Anodizing the aluminum enhances its corrosion resistance and improves its ability to transfer heat. The anodized layer also increases surface durability, particularly in environments with moisture or chemicals. The interior surface of the enclosure may be anodized.

A specialized infrared-emitting coating can be applied to the exterior of the enclosure. When the enclosure heats up, the coating radiates heat in the form of infrared radiation, further improving the overall heat dissipation from the system.

Other surface treatments may be applied, to increase heat transmission by the enclosure.

By combining structural enhancements, such as cooling ribs and sandblasting, with advanced surface treatments, such as powder coating or anodizing, the system significantly enhances its thermal management capabilities. The inclusion of infrared-emitting coatings provides an additional mechanism for heat transfer, leveraging radiation as a means to cool the system more efficiently.

In addition to these thermal benefits, the system's metal enclosure also improves the mechanical robustness of the PCB board and protects the enclosed components. The high-strength metal enclosure offers superior protection against physical stresses, such as vibration, impacts, and external pressures. This added durability not only safeguards the electronics from physical damage but also increases the product's lifespan in demanding environments. These design choices ensure that the system not only maximizes heat transfer from the internal liquid to the external environment but also contributes to the overall mechanical resilience, energy efficiency, and reliability of high-performance electronics.

Figures 5A, 5B:
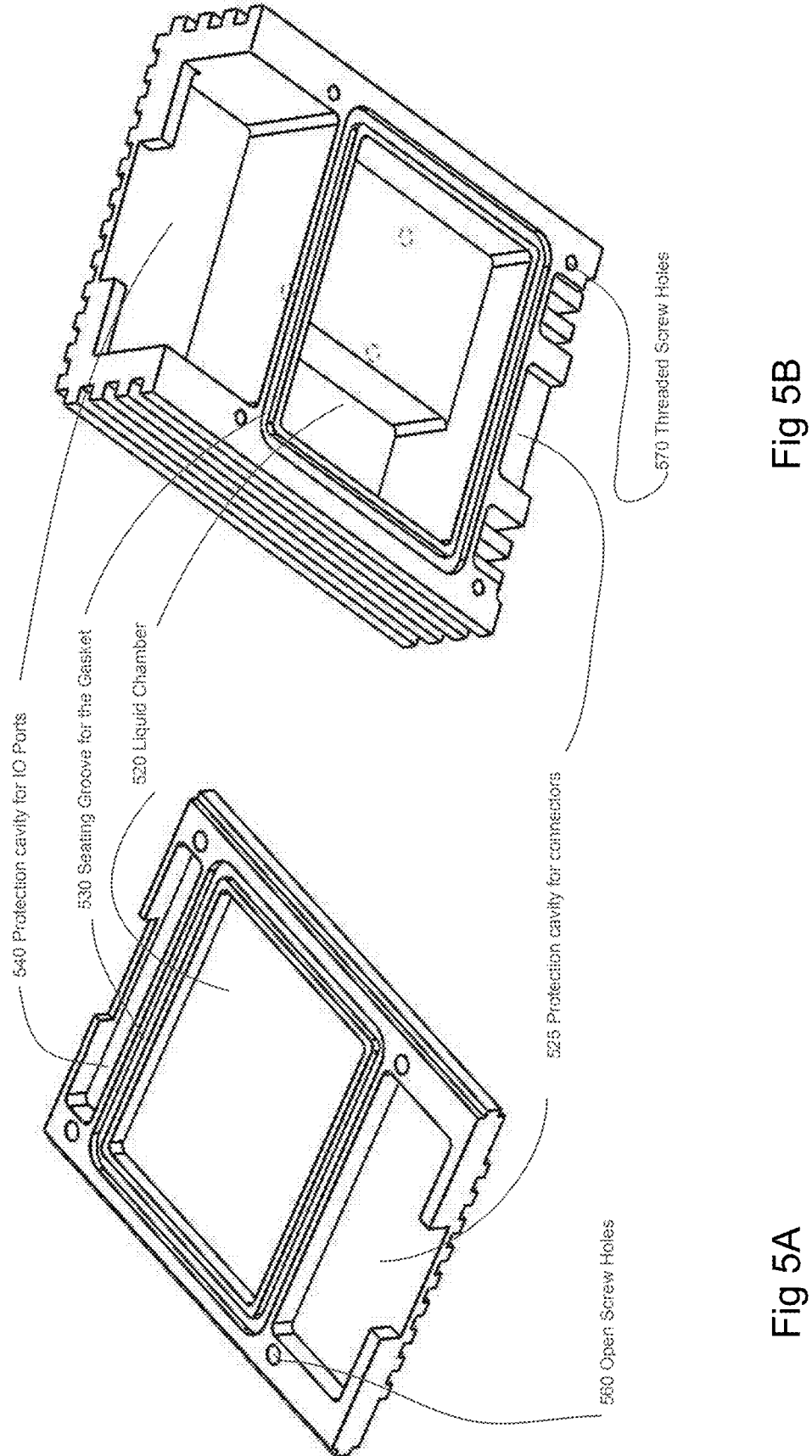
FIGS. 5A and 5B are interior views of an exemplary version of the top and bottom of the enclosure.

FIGS. 5A and 5B are interior views of a particular configuration of the top component and bottom component of the enclosure. The enclosure includes a first compartment or chamber which is liquid filled, which is liquid chamber 520. The enclosure includes a seating groove for the gasket 530, surrounding the liquid chamber 520. In one embodiment, the enclosure may also include a second compartment, a protection cavity 525, 540, for components, outside the liquid chamber 520. This protection cavity 525, 540 enables the enclosure to enclose the entire printed circuit board, while keeping the I/O ports and other connectors outside the liquid chamber 520. In one embodiment, one portion of the enclosure has open screw holes 560, while the other has threaded screw holes 570 to receive the screws attaching the enclosure parts to each other. In another embodiment, the top and bottom parts of the enclosure may each have two open screw holes and two threaded screw holes. In some embodiments, the top and bottom portions of the enclosure are symmetric.

Figure 6A:
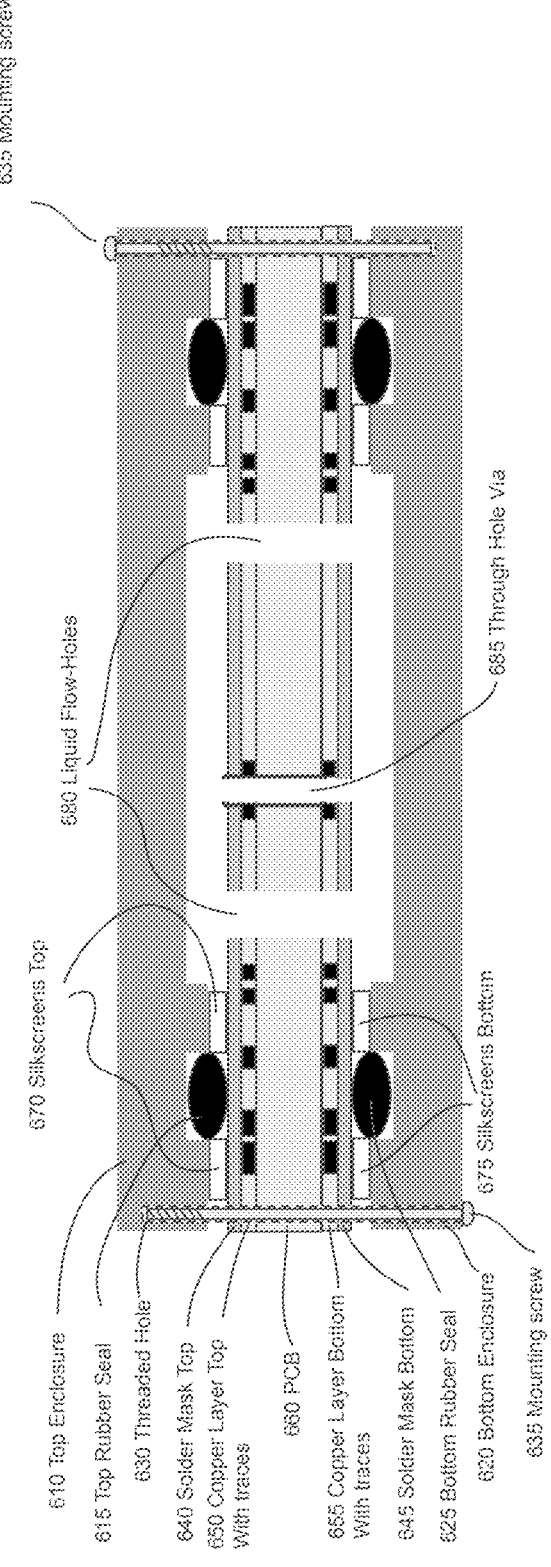
FIG. 6A is a cross-section view of the liquid cooling system with a symmetric attachment.

FIG. 6A is a cross-section view of a liquid cooling system, showing symmetric attachment. In this configuration, one of the mounting screws 635 is inserted through the top enclosure 610 with a threaded screw hole in the bottom enclosure, and the other vice versa. This configuration enables the use of symmetric top 610 and bottom 620 chambers. As can be seen, the top and bottom enclosure components in this cross-section appear identical. However, in some other embodiments, the two parts of the enclosure may have different shapes, to accommodate the configuration of components on the PCB.

In various embodiments, the system includes one or more liquid flow-holes 680 or liquid vias through the printed circuit board 660. The liquid flow-holes 680 allow the transfer liquid used to cool the components to circulate around the chamber. The PCB 660 may also include one or more component vias 685. Such component vias 685 are generally plated with metal to enable connection of components.

Figure 6B:
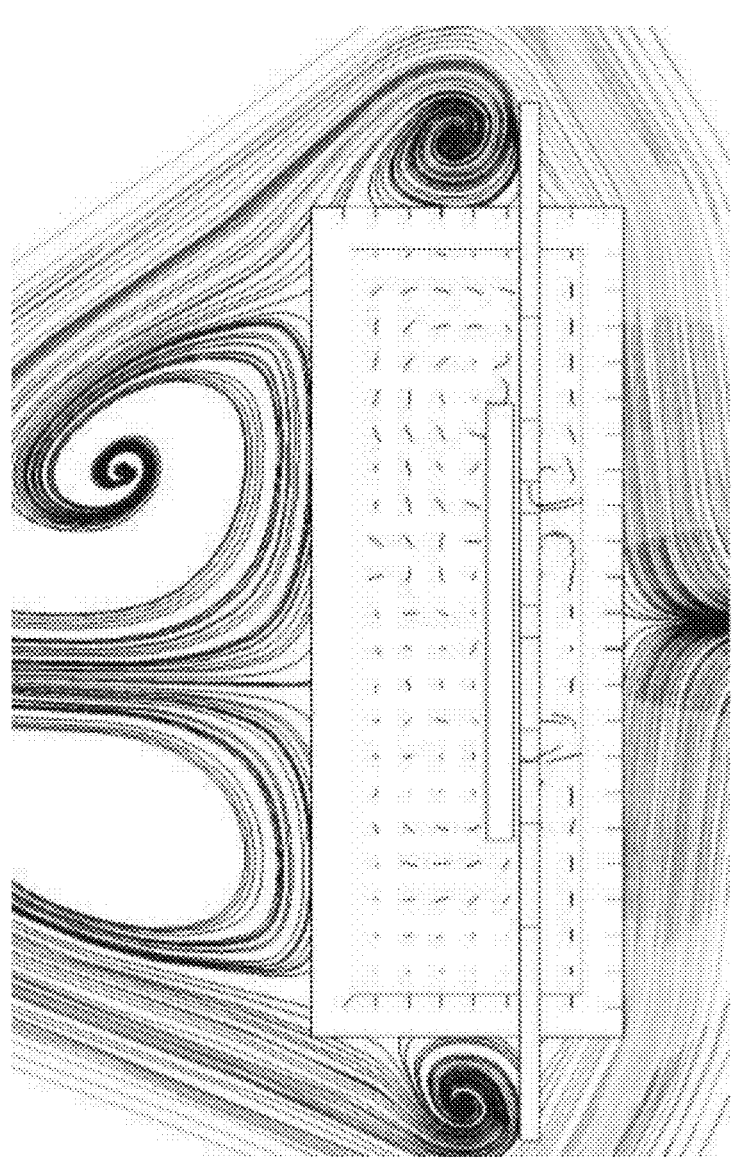
FIG. 6B is an illustration of a simulation of the movement of the transfer liquid within the enclosure.

FIG. 6B is an illustration of a simulation of the liquid flow inside and airflow outside the enclosure. As can be seen, the transfer liquid rises from the heat from the chip, and cools as it reaches the outside of the chamber. The cooled transfer liquid then drops, and this creates a convection illustrated by the lines shown. The transfer liquid used may be a two-phase transfer liquid, which includes a liquid and gas phase in use. Here, the majority of the transfer liquid is in the liquid phase and some of the transfer liquid is in the vapor/gas phase. The transition from the liquid phase to the gas phase requires energy, and the transition in the opposite direction releases energy. As such, in operation, the liquid absorbs heat, causing it to evaporate. It then condenses back into a liquid at a different location, effectively transferring heat from one location within the system (specifically, where the heat-generating components are) to another location within the system (specifically, a place where the heat can be transferred out of the system).

Figure 6C:
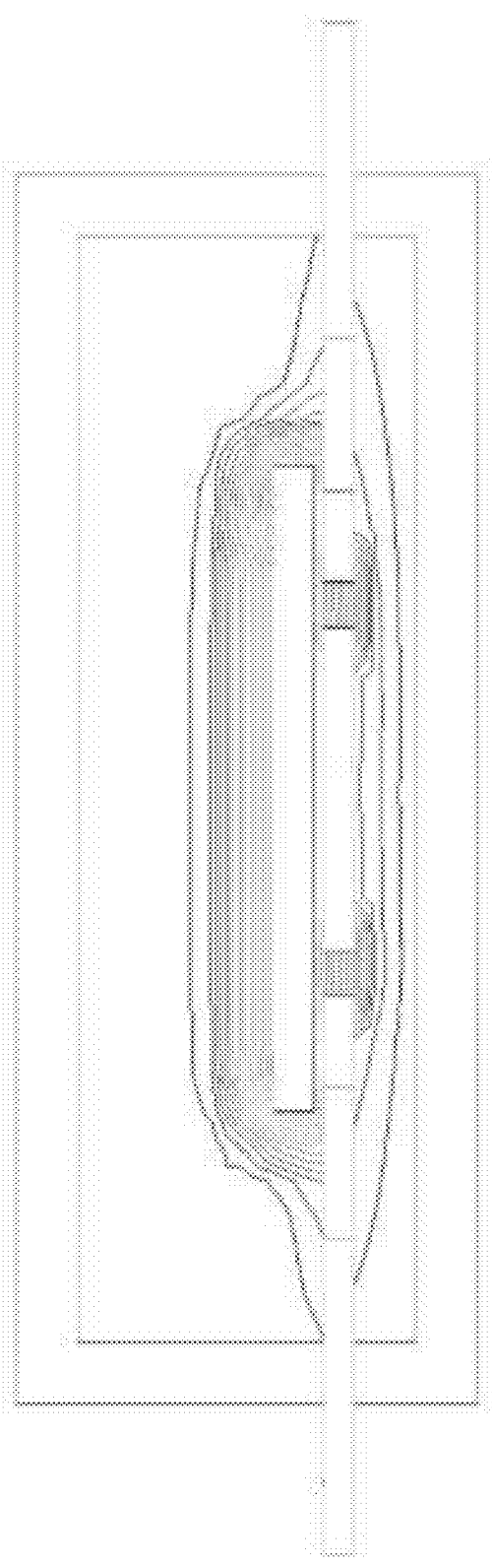
FIG. 6C is an illustration of a simulation of heat dissipation within the enclosure.

FIG. 6C illustrates the hot regions of the chip inside the enclosure. As can be seen, once the heated transfer liquid moves away from the heat source (chip), it rapidly cools down, and thus the circulating transfer liquid can be used for cooling the chip, with a relatively small gap between the top of the chip and the top of the enclosure. The present system optimizes the position and size of the liquid flow-holes, which allows the transfer liquid to flow between the top and bottom parts of the system. Simulations show that 1.5 mm flow-holes underneath a circuit perform better than larger holes, because the increased flow rate through smaller holes improves cooling by supplying cooler liquid more rapidly. In various embodiments, the liquid flow-holes underneath a chip to be cooled are sized between 1 and 3 mm. Liquid flow-holes in different locations may be differently sized. The liquid flow-holes underneath a chip may be smaller than the liquid flow-holes on the PCB around the chip(s). The maximum size of the liquid flow-holes underneath the chip is defined by the spacing between the BGA balls/contacts. The liquid flow-holes are designed not to interfere with the connections of the component to the printed circuit board.

Figures 7A, 7B:
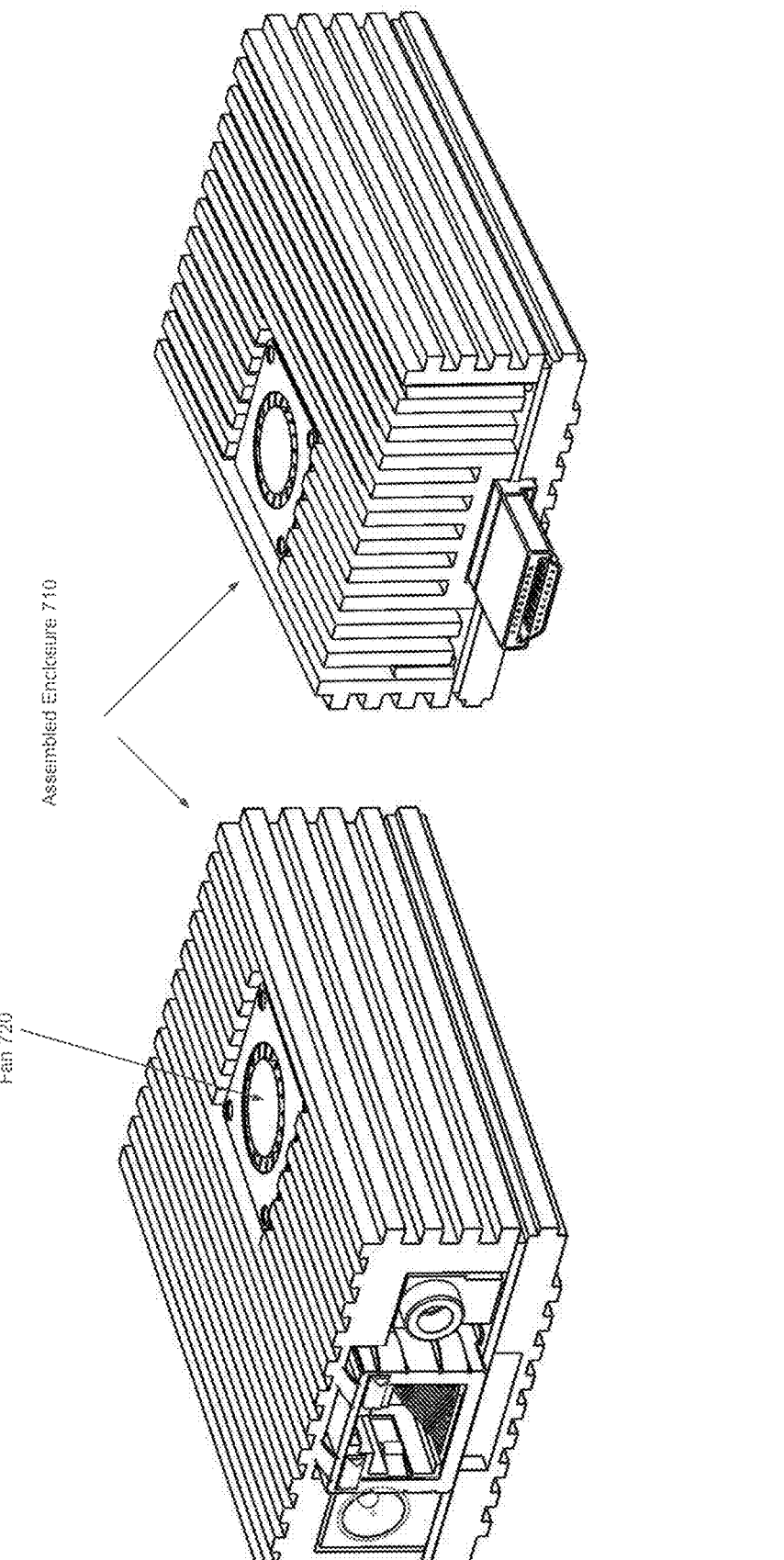
FIGS. 7A and 7B are perspective views of the front and back of the enclosure of one configuration of the liquid cooling system.

FIGS. 7A and 7B are perspective views of one embodiment of the front and back of an assembled enclosure of the liquid cooling system. The assembled enclosure 710 has fins all the way around it and provides opening for the connectors to other components. In the configuration shown, there is a fan 720 integrated among the fins, to increase airflow along the outside of the enclosure 710.

Figure 8A:
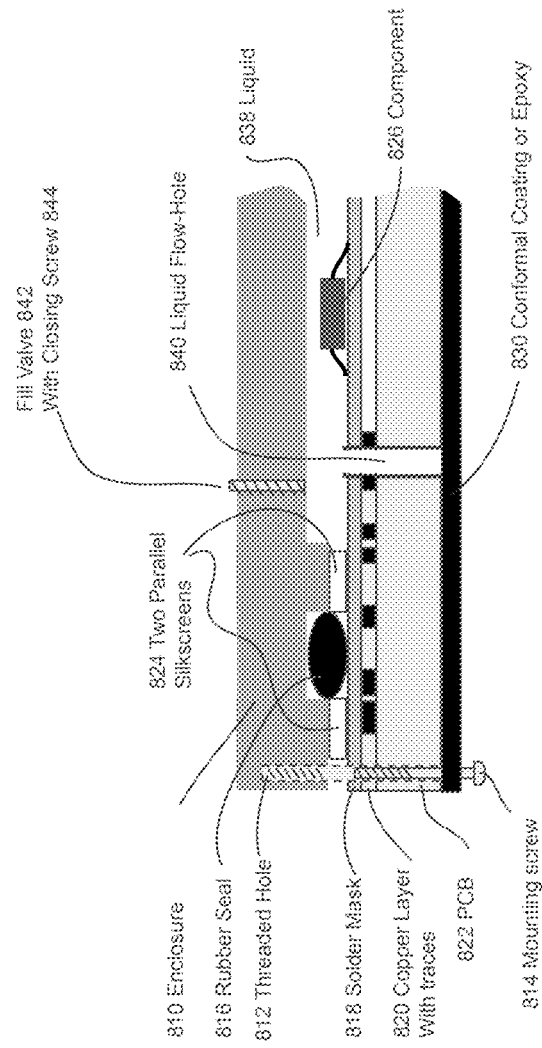
FIG. 8A is an illustration of the liquid cooling system including a fill valve and conformal coating for a one-sided system.

FIG. 8A is an illustration of a liquid cooling system including a fill valve and conformal coating for a one-sided system. In this configuration, the enclosure 810 has only one side, and the opposite side of the PCB is coated with a conformal coating 830, which is leakproof. Thus, the liquid 838 is circulating only on one side of the printed circuit board 822. In this configuration, the hot components 826 needing cooling are on one side of the printed circuit board 822. The conformal coating 830 can be an epoxy, parylene, a silicone-based coating, urethane, acrylic, fluoropolymer, or another material that is leakproof and can withstand the transfer liquid and the heat levels within the chamber. In one embodiment, there may be one or more liquid flow-holes 840 in the printed circuit board 822. The liquid flow-hole may be plated, to provide improved cooling, by contacting the metal layers within the PCB.

In various embodiments, the enclosure 810 includes a fill valve 842. The fill valve 842 allows the addition of the liquid 838 to the interior of the chamber 810. The fill valve 842 includes one or more threaded holes into the enclosure. Once the liquid is filled to the designated level in the chamber, the fill valve is closed with a closing screw 844, a closing bolt, a plug, or another type of fastener to securely close the fill valve 842. The fill valve may include a one-way valve element, which allows the entrance of liquid through the valve, but keeps the liquid from exiting through the valve.

Figure 8B:
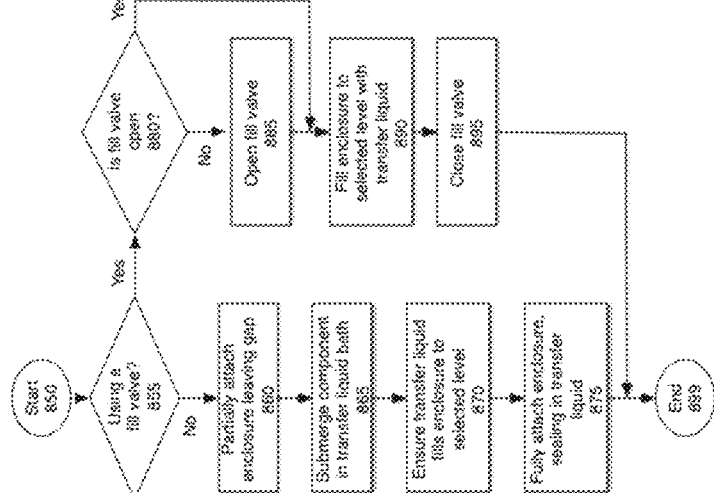
FIG. 8B is a flowchart of various embodiments of filling the liquid cooling system.

FIG. 8B is a flowchart of various embodiments of filling the liquid cooling system. The process starts at block 850. At block 855, the process determines whether a fill valve is being used. If so, the process continues to block 880. If no fill-valve is used, the process continues to block 860.

At block 860, the enclosure is partially attached to the printed circuit board, leaving a gap. The screw is partially tightened, but enough space is left for the liquid.

At block 865, the enclosure and PCB are submerged in a transfer liquid bath, and at block 870, the transfer liquid fills the enclosure. The transfer liquid only partially fills the enclosure, to enable the expansion of a two-phase transfer liquid when it turns to gas. Alternatively, if it's a one-phase transfer liquid that remains liquid during all relevant temperatures, and does not expand when heated, the liquid may fully fill the enclosure.

At block 875, the enclosure is fully attached, providing a leakproof seal, sealing in the transfer liquid. The enclosure and PCB are then removed from the transfer liquid bath. The process then ends, at block 899.

If, at block 855, the process determined that a fill valve is used, the process continued to block 880.

At block 880, the process determines whether the fill-valve is open. If not, at block 885, the fill valve is opened. Note that in this configuration the enclosure is fully attached prior to the addition of the liquid. Thus, the enclosure is sealed to the printed circuit board in a leakproof way.

At block 890, the fill valve is used to fill the liquid to the appropriate level in the chamber. As noted above, the fill may be to a level allowing expansion of the transfer liquid, including a two-phase transfer liquid, if that is used.

At block 895, the fill valve is sealed. The fill valve may be sealed using a screw, a plug, or another component. The filling may also include changing the pressure level in the enclosure. Changing the pressure in the enclosure may include using a vacuum pump to remove some or all of the remaining air from the chamber to reduce the pressure in the chamber. Changing the pressure may further include adding additional air or another gas, which may be heavier or lighter than air, to increase the pressure in the chamber. By altering the pressure in the chamber, the flow pattern of the transfer liquid may be altered. The process then ends at block 899.

Figure 9A:
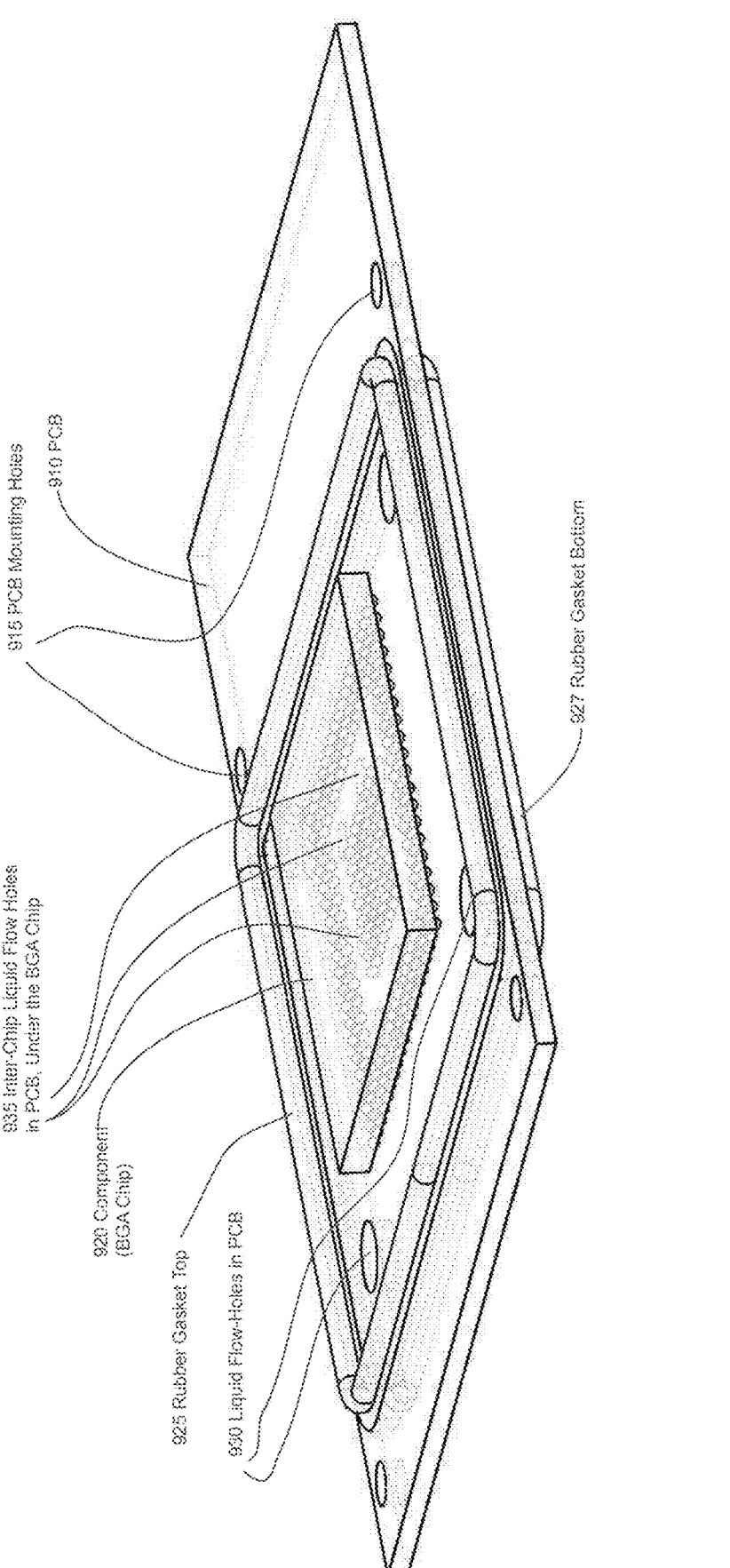

FIGS. 9A-9E are illustrations of various embodiments of cooling using the liquid cooling system. FIG. 9A illustrates a configuration with a single BGA chip 920. In this illustration, the rubber gasket 925, 927 for the top component and the bottom component of the enclosure are shown, but the top and bottom enclosures are not illustrated. The design includes liquid flow-holes 930 in the PCB 910. There are liquid flow-holes 930 in proximity to the component 920. For a BGA (ball grid array) coupled integrated circuit (as illustrated), there are additional inter-chip liquid flow-holes 935 underneath the BGA chip, among the solder balls of the ball grid array. This provides improved cooling, where the transfer liquid contacts not only the top of the chip 920, but also the bottom of the chip, through inter-chip liquid-flow-holes 935. Although only a single chip is illustrated, one of skill in the art would understand that this configuration may include a plurality of chips, with inter-chip liquid flow-holes underneath some or all of the components on the printed circuit board. One or more of the chips may have inter-chip liquid flow-holes 935 underneath the chip. This configuration utilizes a two-sided enclosure. The liquid which is in contact with the bottom of the chip 920 may flow out between the ball interconnection pins, or through other liquid flow-holes 935.

Figure 9B:
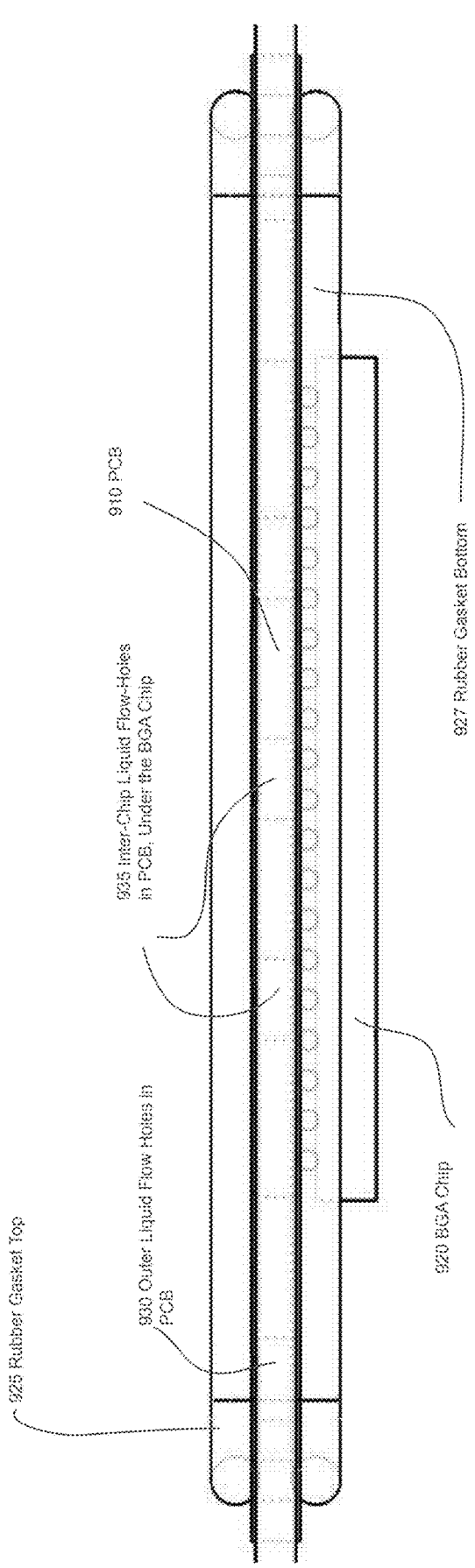

FIG. 9B is a semi-transparent side-view, which shows the enclosing rubber gasket 925, as well as the outer liquid flow-holes 930 and the inter-chip liquid flow-holes 935 under the BGA chip of FIG. 9A.

Figure 9C:
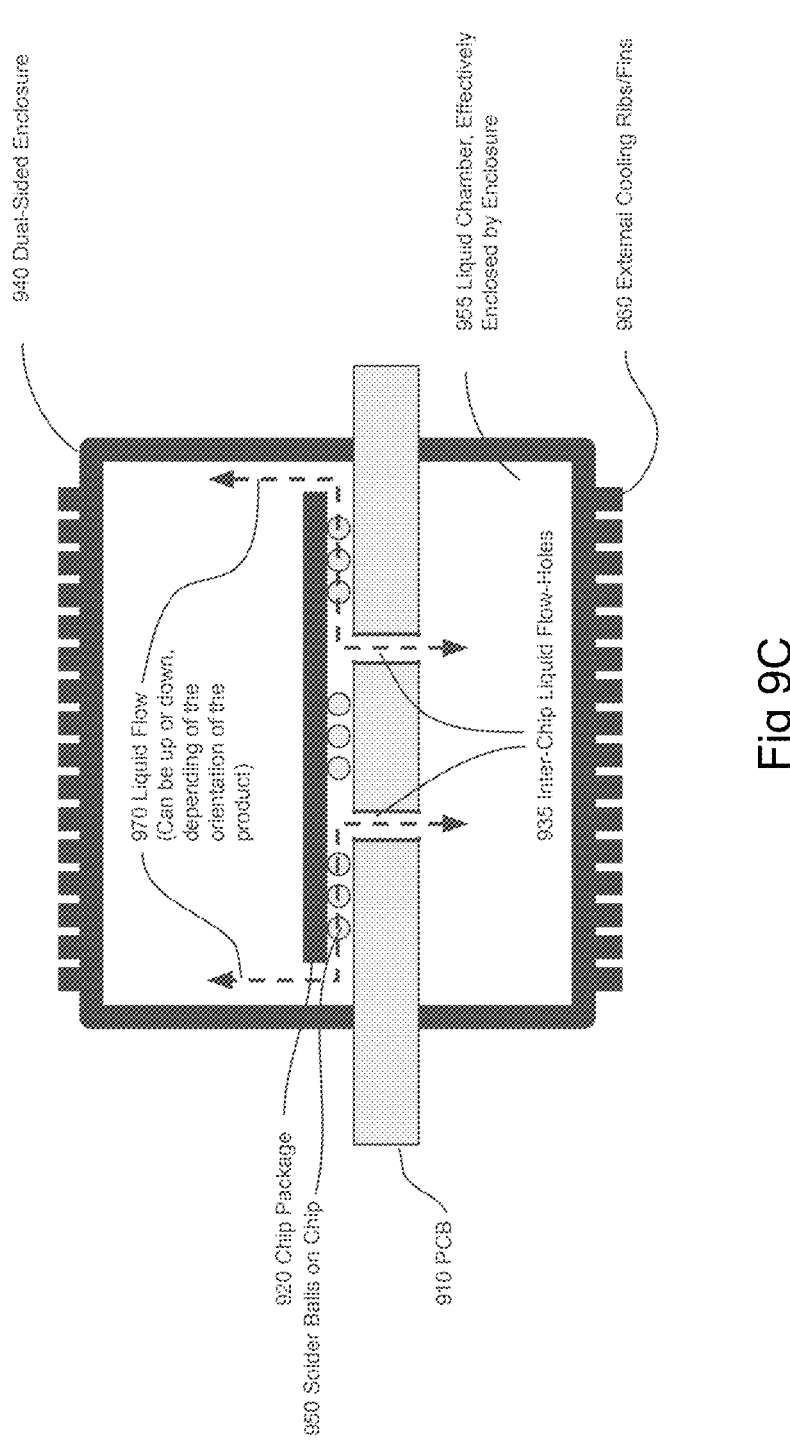

FIG. 9C is a simplified illustration of the design. The printed circuit board 910 has a dual sided enclosure 940 which surrounds the BGA chip 920. The BGA chip 920 has a plurality of solder balls 950 which provide a connection between the BGA chip 920 and the printed circuit board 910. The solder balls 950 are arranged in a pattern, for example the pattern shown in FIG. 9B.

The printed circuit board has inter-chip flow-holes 935 underneath the chip 920, which allow the liquid flow 970 through the PCB 910, between the top and bottom of the dual sided enclosure 940. The liquid flow 970 in one embodiment, can be up or down, depending on the orientation of the system. In various embodiments, the liquid within the dual sided enclosure 940 moves in a pattern, passing the liquid past the hot components 920 to take up the heat, and the external cooling ribs/fins 960 to dump the heat to the outside of the enclosure 940. In one embodiment, in addition to the inter-chip liquid flow-holes 935 illustrated, there may be additional liquid flow-holes through the PCB outside the component's area, as shown in FIG. 9B.

Figure 9D:
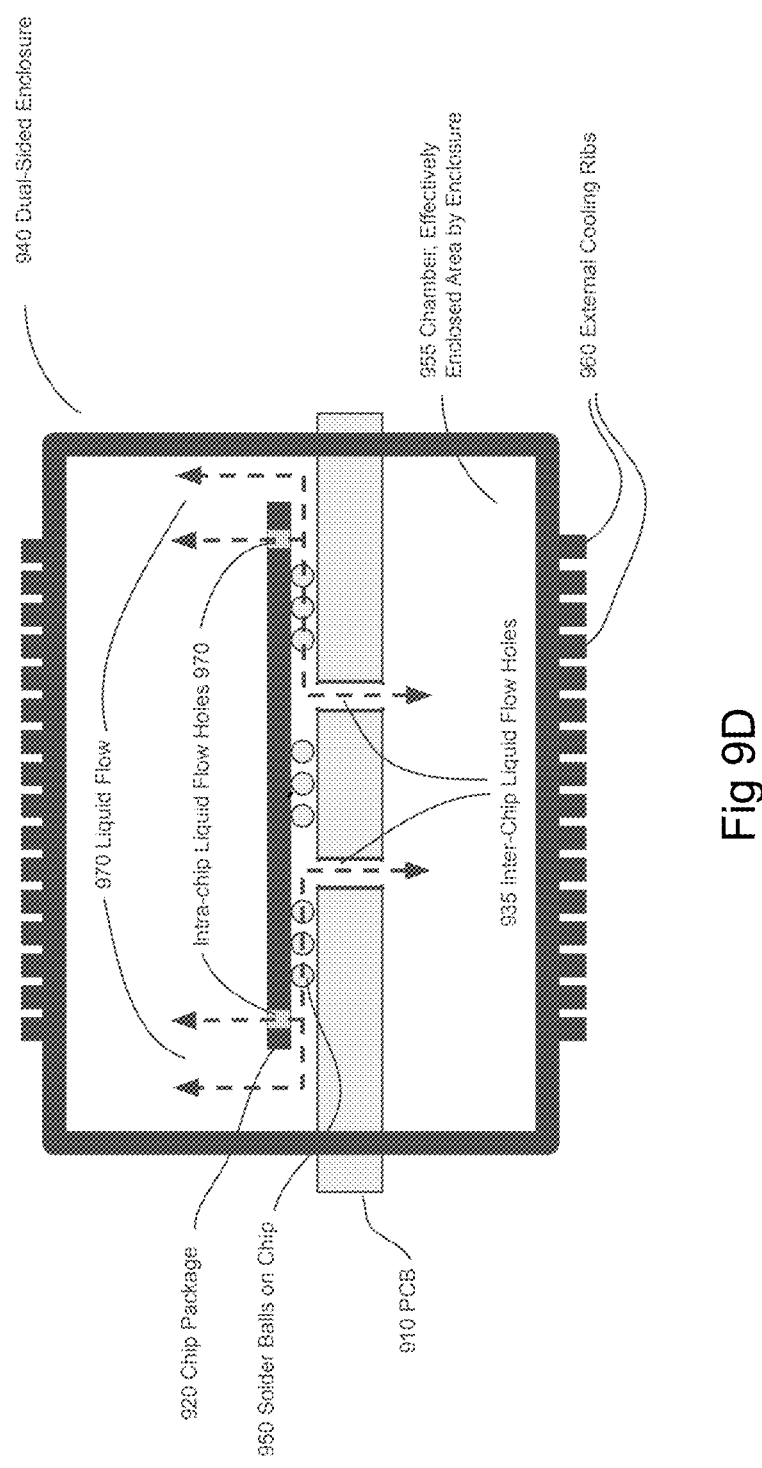

FIG. 9D illustrates one embodiment of a dual-sided enclosure with intra-chip liquid flow-holes, as well as inter-chip liquid flow-holes. In addition to the flow-holes in the PCB 910 underneath a component 920, which are inter-chip flow-holes 935, this configuration also has intra-chip flow-holes 970 through the chip package 920. In one embodiment, the transfer liquid flows through the chip package through intra-chip liquid flow-holes 970, increasing the cooling effect on the interior of the chip package 920, and getting the transfer liquid closer to the actual die which produces the heat. This configuration requires a redesign of the chip package 920, to include the intra-chip flow-holes 970. For intra-chip liquid flow-holes which go through the overmold, the liquid flow-holes may be non-plated, since the overmold is not conductive and thus plating these liquid flow-holes does not provide a cooling advantage.

Figure 9E:
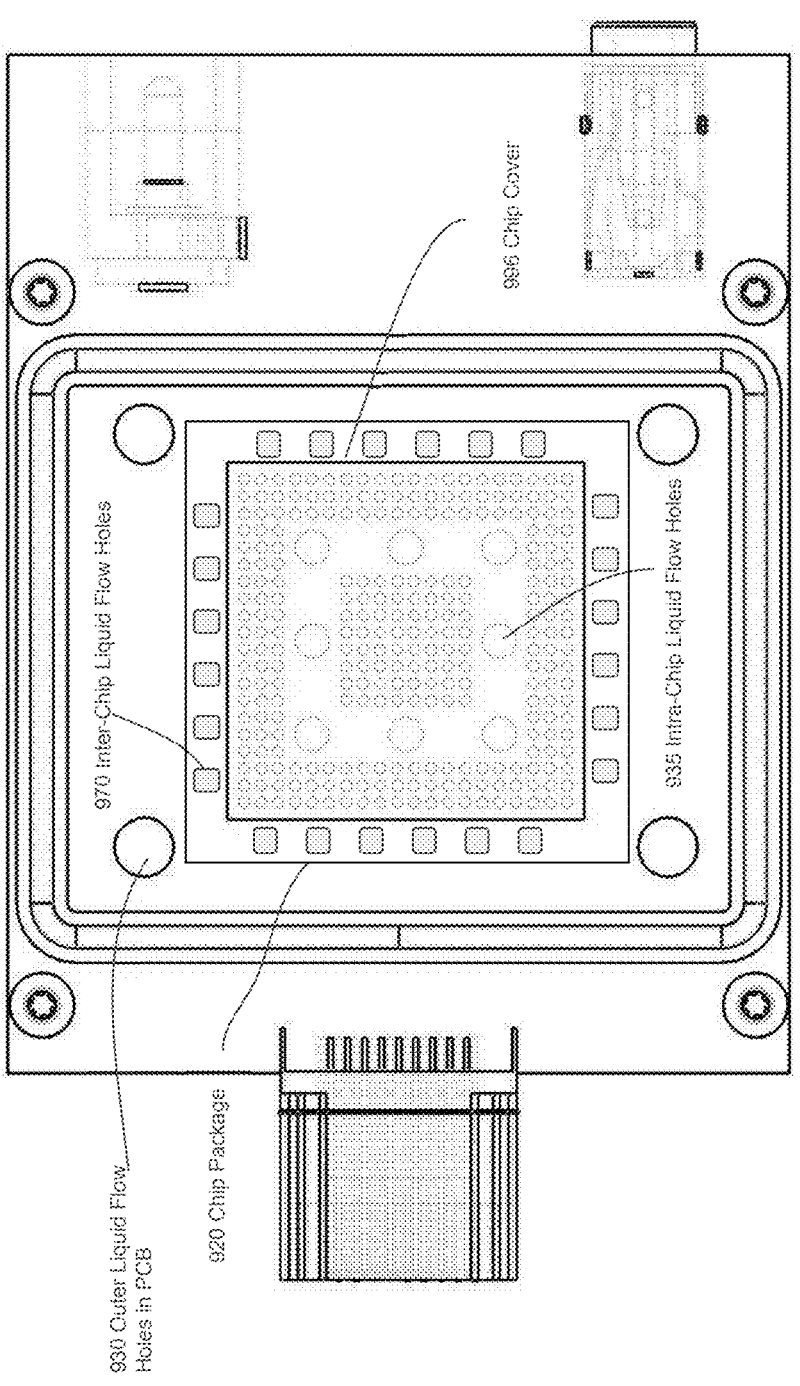

FIG. 9E is a top view of the design, showing all three types of liquid flow-holes. The outer liquid flow-holes 930 in the PCB enable liquid to pass between the two sides of the PCB, for a dual-sided enclosure. The inter-chip liquid flow-holes 935 are holes in the PCB underneath the chip package. The inter-chip liquid flow-holes 935 are positioned so that they are in locations where there are no solder ball contacts for the chip 920. The intra-chip liquid flow-holes 970 are holes in the chip package 920, rather than the PCB, which allow the transfer liquid to be closer to the die within the chip package 920 for improved cooling. The enclosed liquid cooling system described can include one or more of these types of liquid flow-holes. Thus, a single system may include outer liquid flow-holes in the PCB, inter-chip liquid flow-holes underneath components, and/or intra-chip liquid flow-holes in the component packaging. For example, in a single sided enclosure, there may not be outer liquid flow-holes 930.

FIG. 9F is an X-ray of a typical BGA chip, showing the solder balls, and the intra-chip flow-holes 970. These intra-chip liquid flow-holes go through the chip package, allowing liquid to enter the package. This allows the transfer liquid to pass through a portion of the chip package. However, the transfer liquid is not in direct contact with the die, but rather goes through the exterior part of the package, to increase heat transfer, in this configuration. In another configuration, illustrated below, the transfer liquid flows through the chip packaging, and is in direct contact with the die.

Figure 9G:
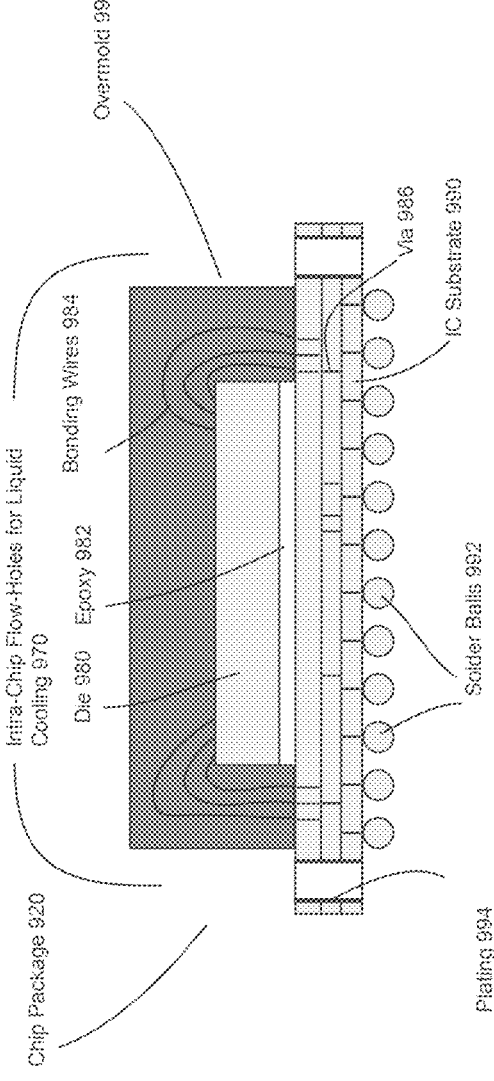
FIG. 9G illustrates intra-chip cooling in which the liquid flow-holes do not go through an overmold of the integrated circuit package.

FIG. 9G illustrates intra-chip cooling in which the liquid flow-holes do not go through an integrated circuit overmold. In this configuration, the chip package 920 includes the die 980, attached to an IC (integrated circuit) substrate 990. A portion of the IC substrate 990 is covered by overmold 996, which may be epoxy, resin, ceramic or another material. The intra-chip liquid flow-holes 970 go through the IC substrate 990. The liquid flow-holes 970 are plated 994, to increase thermal conductivity. The plating 994 is in contact with the interior metal layers of the IC substrate 990. However, the intra-chip flow-holes do not go through overmold 996.

Figure 10A:
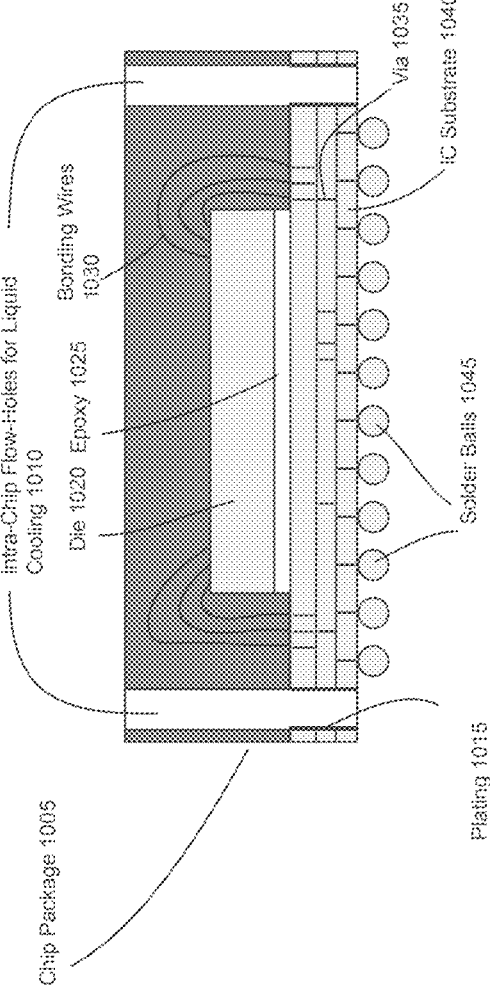
FIG. 10A-10C are illustrations of one embodiment of intra-chip cooling using the liquid cooling system.
Figure 10B:
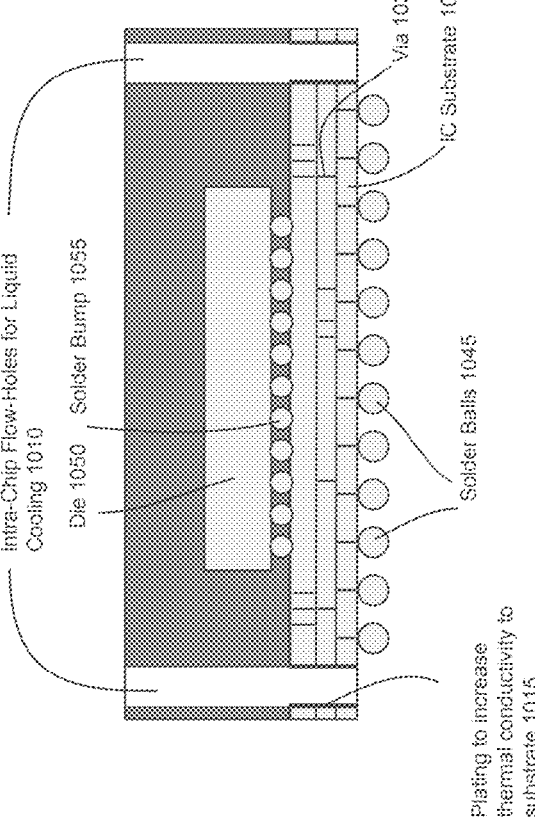
Figure 10C:
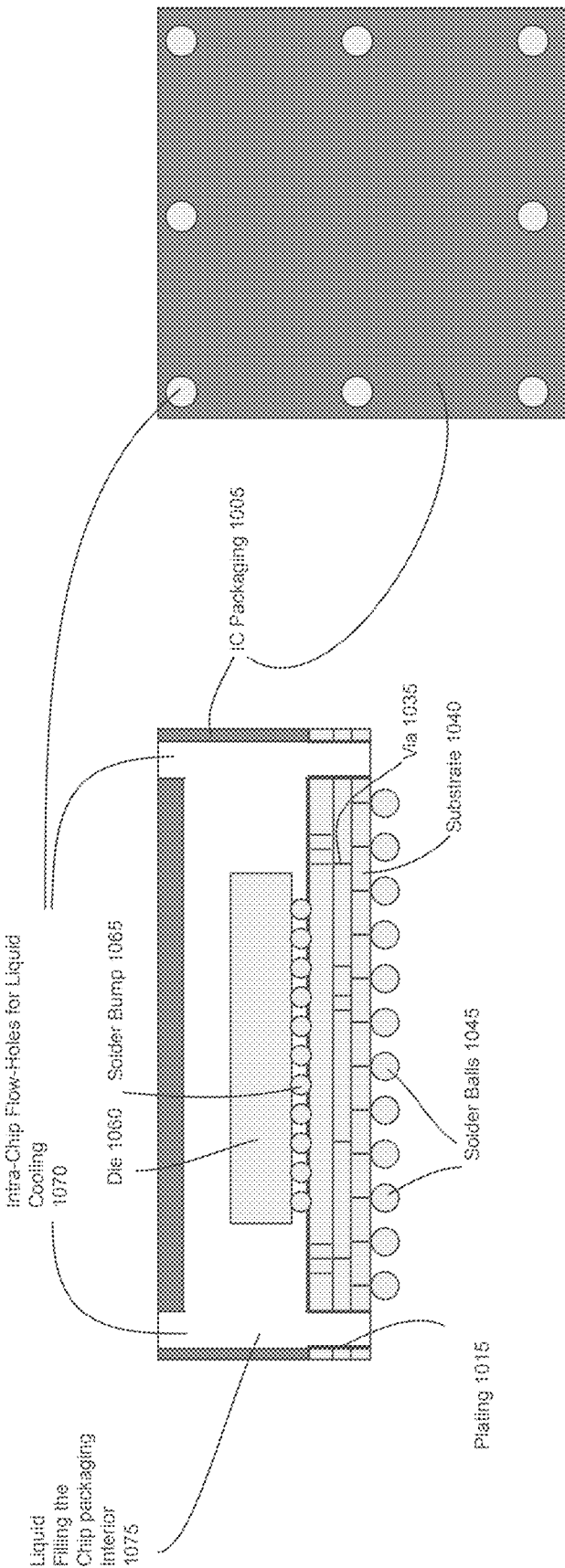

FIG. 10A-10C are illustrations of various embodiments of intra-chip cooling using the liquid cooling system. FIG. 10A illustrates a chip package 1005, which includes intra-chip flow-holes for liquid cooling 1010. The flow-holes 1010 extend through a portion of the overmold, which is an epoxy, plastic, or resin cover on the outside of the chip package 1005. Some or all of the flow-holes 1010 may be plated 1015, to increase thermal conductivity to the substrate. In some configurations, the portion of the intra-chip liquid flow-hole that is in the overmold is not plated, while the portion of the intra-chip liquid flow-hole that passes through the IC substrate 1040 is plated 1015. The chip package 1005 also includes the die 1020, bonding wires 1030, and solder balls 1045, as normal. The intra-chip flow-holes 1010 are positioned so as not to interfere with any of those components. The heat is transferred from the die 1020, through a combination of the epoxy 1025, and partially through bonding wires 1030, solder balls 1045, and the die package itself, and through the metal layer in the substrate 1040, to the liquid flowing through the intra-chip flow-holes 1010. Note that while not illustrated, the chip package 1005 is on a PCB which is enclosed in an enclosure, forming a chamber to contain the transfer liquid.

FIG. 10B illustrates a similar configuration for a wire-bonded ball-grid array chip, in which the die 1050 is coupled to the substrate 1040 through solder bumps 1055. The configuration of the intra-chip through-holes 1010 remains the same. The intra-chip flow-holes may also be used in other types of component packaging and is independent of the packaging format.

FIG. 10C illustrates an exemplary configuration of intra-chip cooling in which the transfer liquid is in contact with the die 1060. The die 1060 is coupled to the substrate 1040. The intra-chip flow-holes for liquid cooling 1070 open into the center of the packaging 1005, such that the liquid 1075 is in direct contact with the die 1060 and interior of the packaging 1005. Plating 1015 may be used on an exterior of the substrate 1040, to increase thermal conductivity.

Figure 10D:
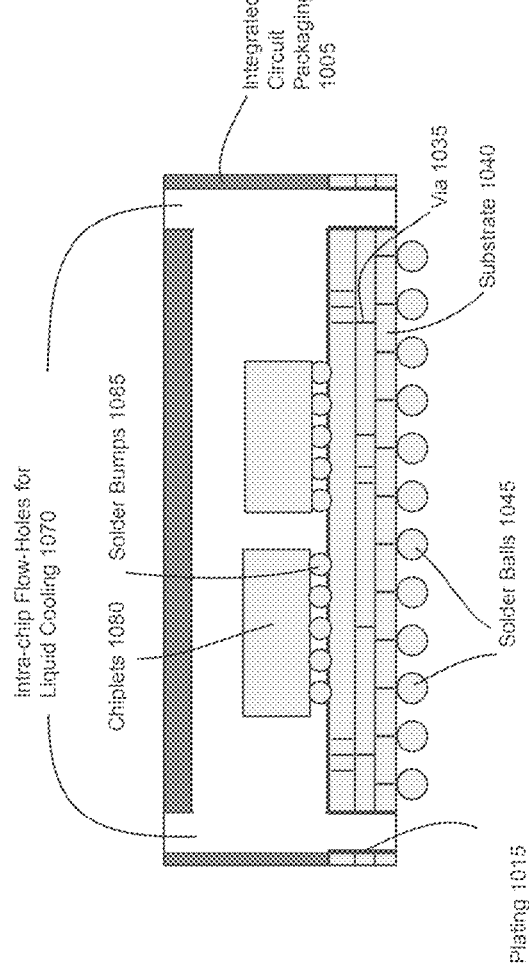
FIG. 10D illustrates intra-chip cooling for a system including chiplets in an integrated circuit packaging.

FIG. 10D illustrates intra-chip cooling for a system including chiplets in an integrated circuit packaging. In this configuration, there are a plurality of chiplets within the integrated circuit packaging 1005. While this configuration illustrates the direct-contact configuration where the liquid is in direct contact with the die(s), one of skill in the art would understand that the configuration shown in FIGS. 10A and 10B, where the flow-holes contain the transfer liquid, and the transfer liquid is not directly contacting the die(s) may be used with chiplets as well.

Figure 11A:
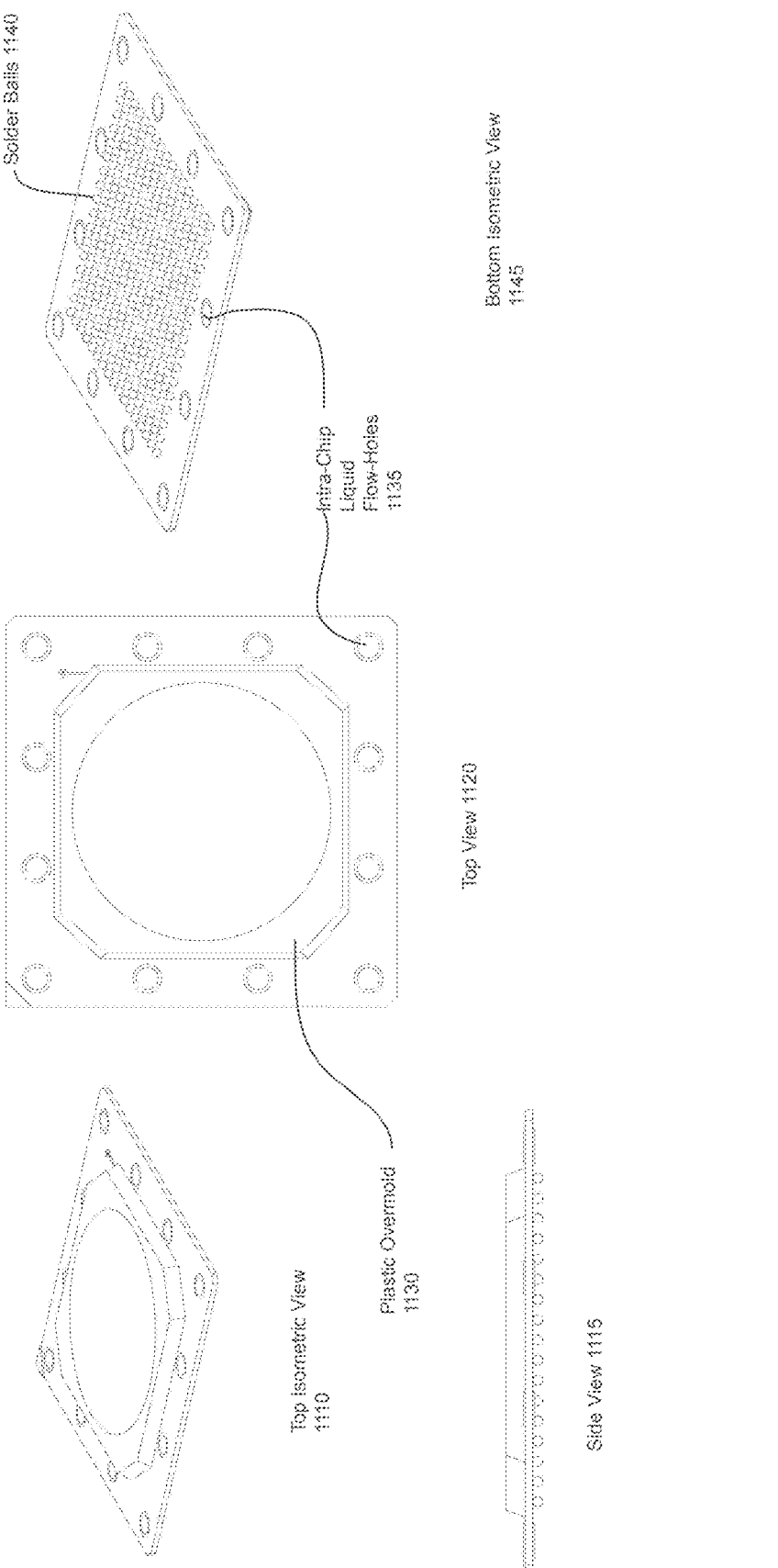

FIGS. 11A-11B are illustrations of a flip-chip type packaging with liquid flow-holes. Flip-chip packaging includes solder balls 1040, and a plastic overmold 1030 covering one or more chiplets or dies. The intra-chip liquid flow-holes 1035 are through a portion of the substrate of the chip packaging, as shown. FIG. 11B illustrates the same flip-chip, without the plastic overmold, showing the die bonded to the substrate, and traces. The intra-chip liquid flow-holes 1185 are on the outside perimeter of the flip chip, in this example. FIGS. 10A-11B illustrated chips with various contact types, and configurations. The present system is chip-type agnostic and may be used with the illustrated types of contacts and chip packaging, or with any other contacts or chip packaging that can be modified to include the intra-chip flow-holes described.

FIG. 12 is an illustration of a cross-section of a chip, with a liquid flow-hole connected to the internal planes of the PCB. The liquid flow-hole 1220 is in contact with the inner planes 1215 of the PCB 1210. The inner planes 1215 of the PCB are generally copper layers, which provide a ground plane for the PCB 1210. By using plating 1230 on the edges of the liquid flow-holes 1220, the thermal transfer from the PCB inner planes to the transfer liquid flowing within flow-holes 1220 is increased. This illustration may be used to understand the connections of the outer liquid flow-holes to the PCB and the intra-chip liquid flow-holes through the IC substrate.

Figure 13A:
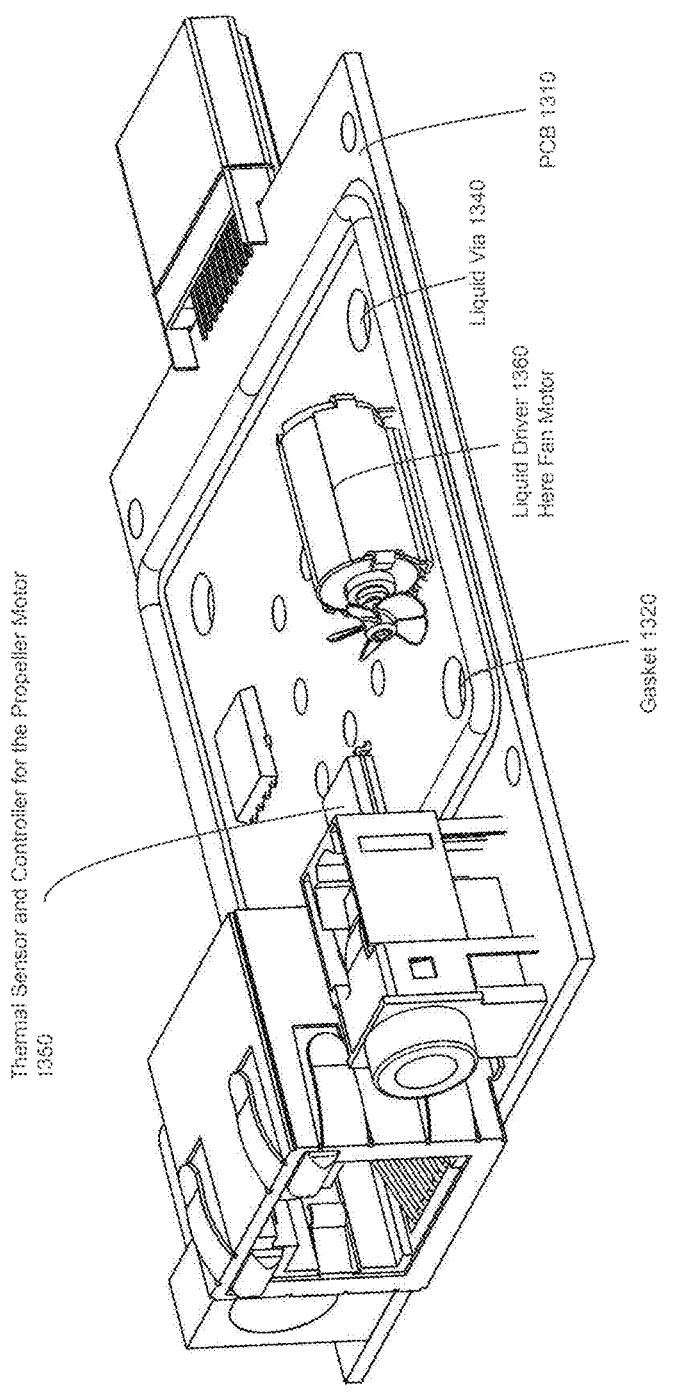
FIGS. 13A-13C are illustrations of various embodiments of the system including a liquid driver.
Figures 13B, 13C:
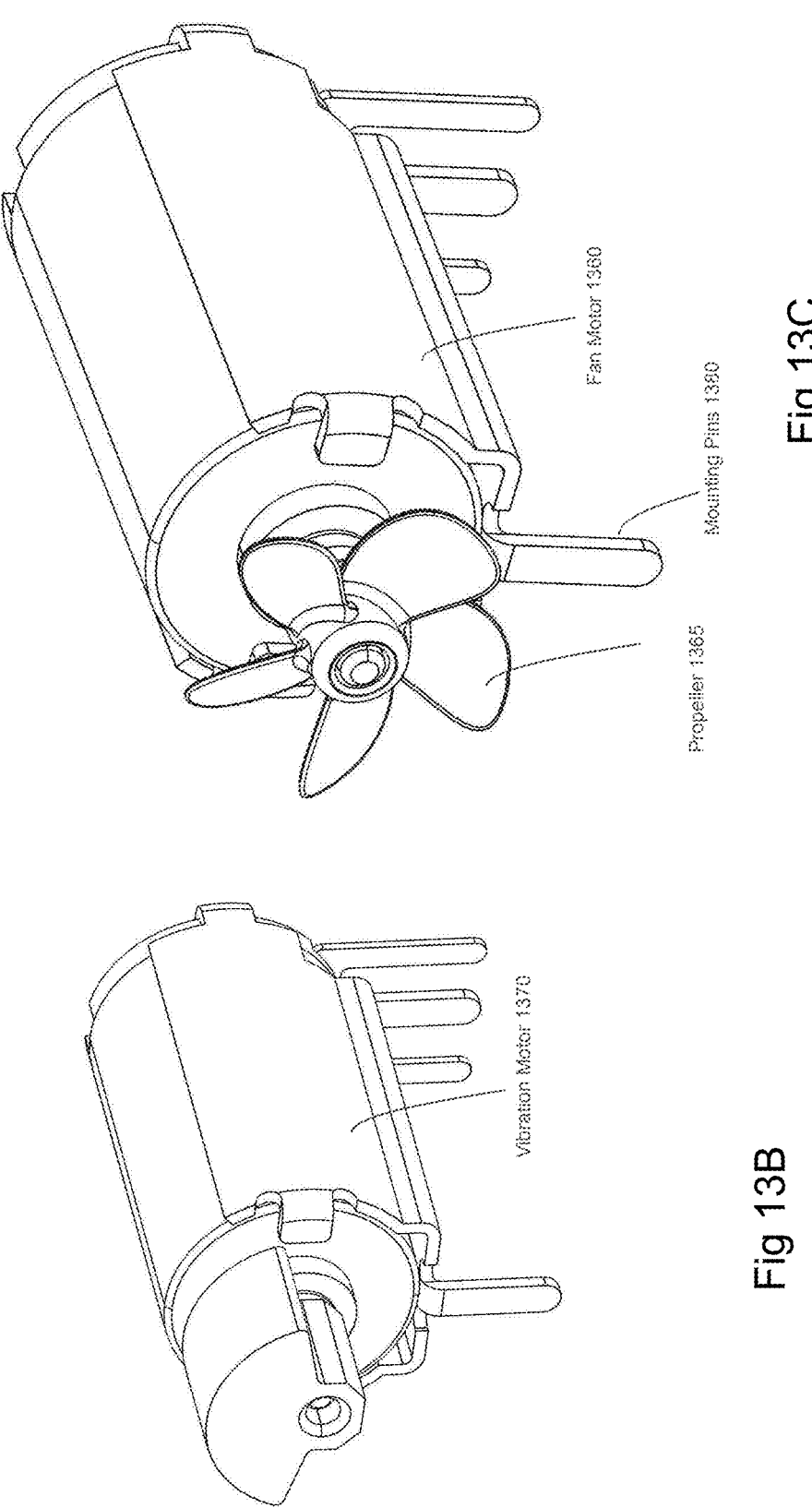

FIG. 13A-13C are illustrations of the system including a liquid driver. The transfer liquid moves through the enclosure due to the fact that when heated the transfer liquid becomes less dense and thus rises, and as it is cooled by contact with the enclosure, it falls. However, in various embodiments, as illustrated in FIGS. 13A-13C, a liquid driver 1036 is added within the enclosure. The liquid driver 1360 may be for example an integrated micropump within the enclosure configured to actively circulate the transfer liquid, a vibration motor within the enclosure to create mechanical agitation, a small submerged fan or propeller, a thermoelectric cooler (TEC) within the enclosure to create a temperature gradient, promoting fluid movement through thermal cycling, a speaker to generate acoustic waves, and a piezoelectric buzzer to create ultrasonic vibrations, promoting the movement of the transfer liquid. Such liquid drivers may be used with all configurations of the enclosure, single sided or double sided, as well as all configurations of the flow-holes.

The liquid driver 1360 may be continuously on, to move the transfer liquid continuously, or the system may turn the liquid driver on and off as needed. The system may include a thermal sensor and controller 1350 for the liquid driver 1360. The thermal sensor and controller 1350 may be one or more chips within the enclosure, which provide temperature sensing and control the operation of the liquid driver 1360. In this embodiment, the controller 1350 may turn on the liquid driver 1360 when the temperature is above a threshold. By using a sensor and controller 1350, the system can adjust the speed and direction of the motor to control the flow rate and pattern of the transfer liquid, and to reduce power consumption by the liquid driver 1360 when it is not needed, or a reduced rate is sufficient. FIG. 13A illustrates an exemplary fan motor, which may be used as the liquid driver.

FIG. 13B illustrates a vibration motor which may be used as the liquid driver. These types of motors are commonly used in various applications to provide haptic feedback, such as in mobile phones, gaming controllers, and other handheld devices. The vibration motor 1370 includes a housing/casing, an eccentric mass, a motor shaft, a commutator and brushes, windings/coils, and mounting pins/leads. The housing/casing is the outer cylindrical structure that protects the internal components of the motor. It is typically made of metal or durable plastic to provide structural integrity and protection. Inside the housing, there is an eccentric mass (often an off-center weight) attached to the motor's shaft. When the motor spins, this mass creates an imbalance, resulting in vibration. The motor shaft is the rotating axis connected to the eccentric mass. The rotation of the shaft is what drives the vibration. Inside the motor, the commutator and brushes facilitate the flow of current through the windings, causing the motor to rotate. The motor includes windings/coils that create a magnetic field when electric current passes through them. The interaction between this magnetic field and the permanent magnets inside the motor generates rotation. Alternatively, a non-magnetic driver may be used, as is known in the art. Mounting pins/leads extend from the motor housing and are used to secure the motor to the PCB and provide electrical connectivity.

When electrical power is supplied to the motor 1370 through the mounting pins/leads, current flows into the windings. The current through the windings generates a magnetic field that interacts with the permanent magnets inside the motor, causing the shaft to rotate. As the motor shaft rotates, the eccentric mass creates a centrifugal force because it is off-center. This force generates a vibration. The vibration is transmitted through the motor housing to the PCB and subsequently to the device it is mounted in, providing movement to the transfer liquid, and increasing the rate of circulation.

FIG. 13C illustrates a propeller motor, which may be used in the present system as the liquid driver. The propeller motor is similar to the vibration motor described above, but instead of having an eccentric weight to produce vibration, it has a propeller attached to the shaft. This configuration is designed to create a flow of liquid, enhancing the cooling efficiency in the system. The propeller can be configured to produce one of: a unidirectional flow of the transfer liquid and multidirectional flow of the transfer liquid.

The system includes a housing/casing, a propeller, a motor shaft, commutator and brushes, windings/coils, and mounting pins/leads, in one configuration. The housing protects the internal components and provides a structural mount to the PCB. It ensures the motor's durability and integrity. A motor shaft is connected to the motor. A propeller is attached to the motor shaft—the propeller is responsible for increasing the speed of flow of liquid within the cooling chamber. The design of the blades ensures efficient movement of the transfer liquid.

Inside the motor, the commutator and brushes facilitate the flow of current through the windings, causing the motor to rotate, and windings/coils generate a magnetic field when electric current flows through them, interacting with the permanent magnets inside the motor to produce rotation. The mounting pins secure the motor to the PCB and provide electrical connectivity to power the motor.

When electrical power is supplied to the motor through the mounting pins/leads, current flows into the windings. The current generates a magnetic field in the windings, interacting with the permanent magnets inside the motor to rotate the motor shaft. The rotation of the motor shaft turns the propeller, creating a flow of liquid within the chamber. The increased speed of liquid flow generated by the propeller helps distribute heat more evenly within the chamber, improving the overall cooling efficiency. This can significantly improve the performance and reliability of electronic components by maintaining more uniform temperatures across the entire surface of the cooled components.

In another embodiment, a different type of motor may be used as part of the liquid driver. The motor may not include permanent magnets, such as an induction motor, a wound rotor motor, a synchronous reluctance motor, an electrostatic motor, or a type of motor using piezoelectric elements.

The liquid driver can be adapted to different sizes and configurations of cooling chambers, making it versatile for various applications. The use of a propeller motor within an enclosure in a liquid cooling system represents a significant advancement in maintaining optimal operating temperatures for high-performance electronic components.

Figure 14A:
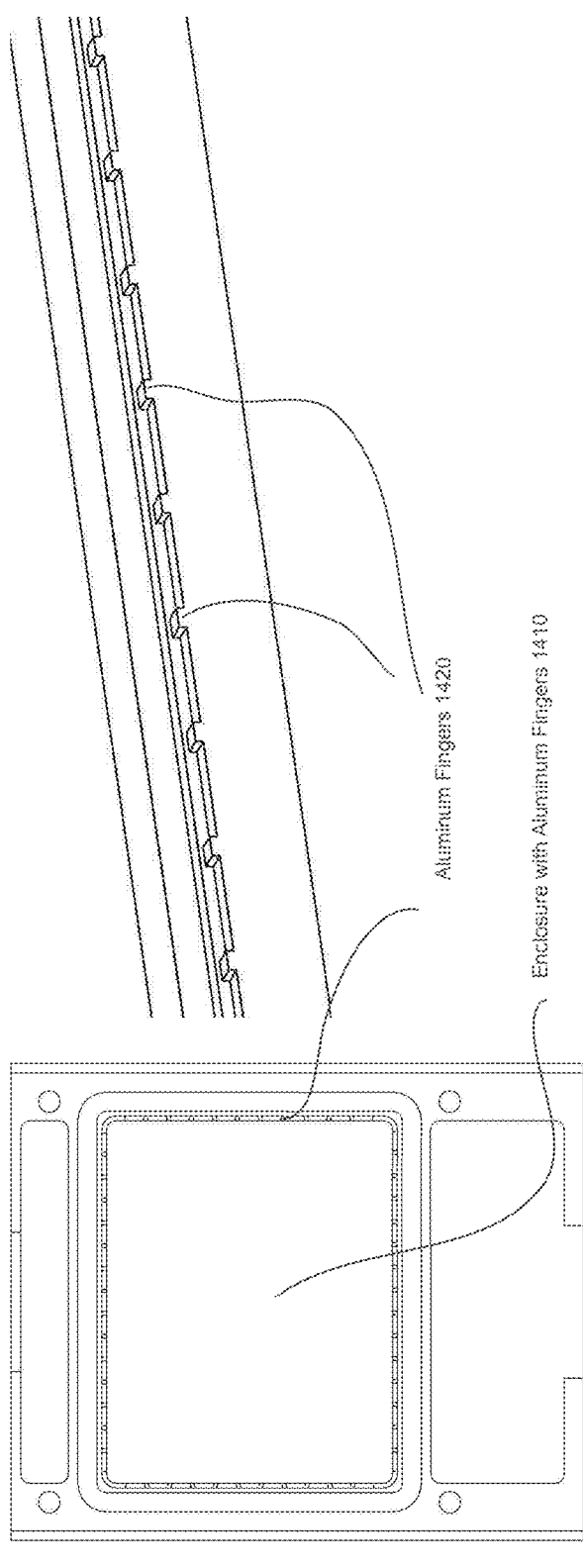
FIGS. 14A-14C are illustrations of one embodiment of the liquid cooling system that provides electrical isolation.
Figure 14B:
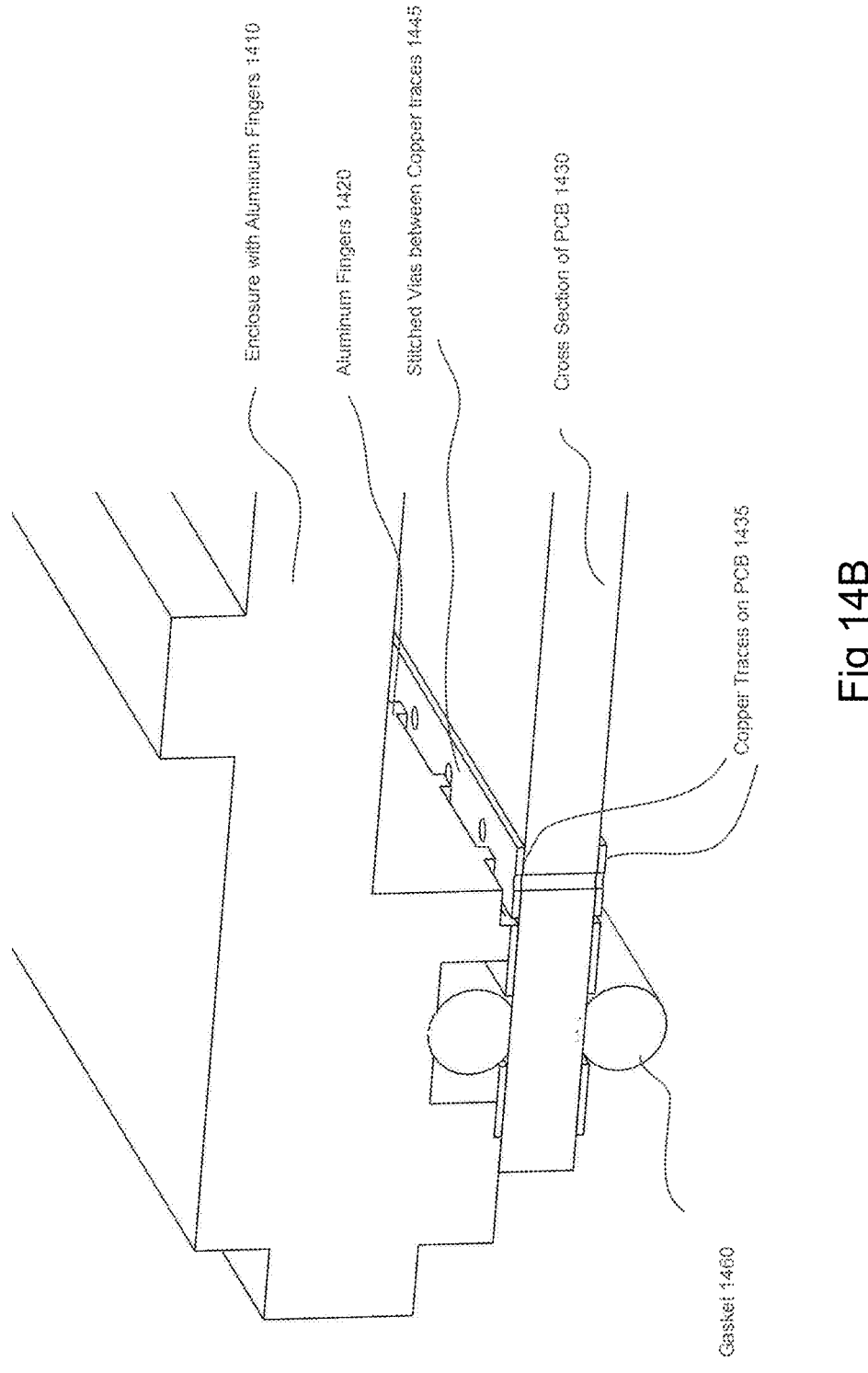
Figure 14C:
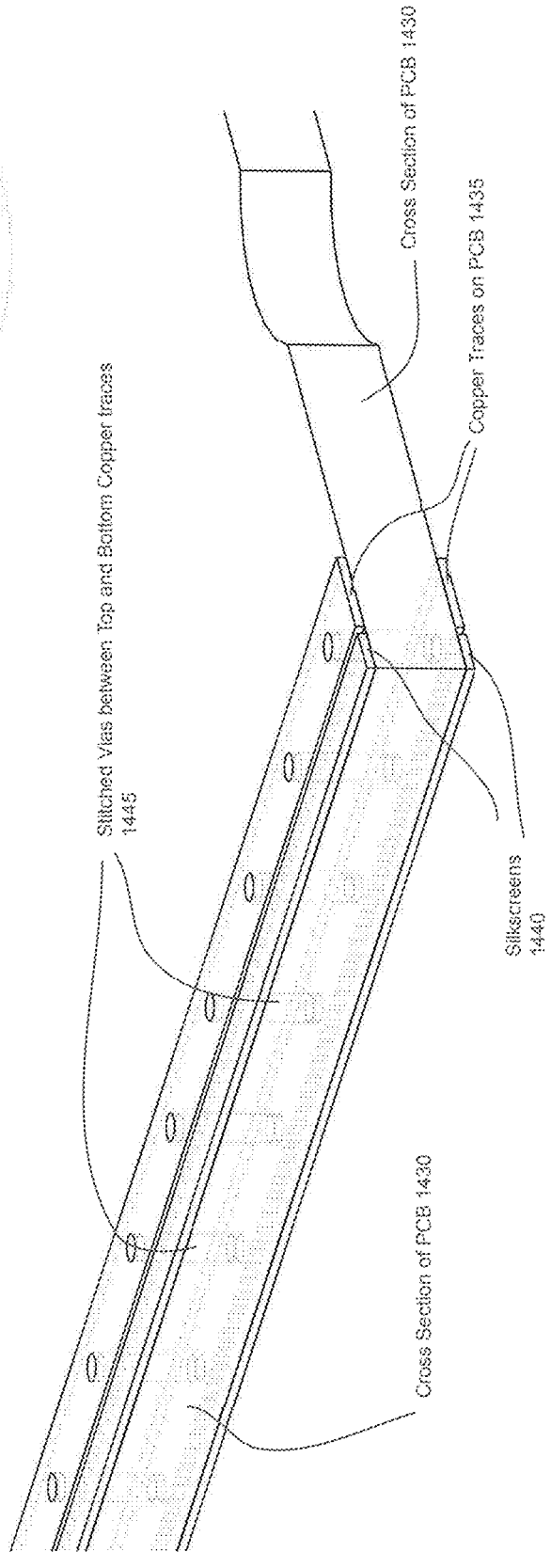

FIGS. 14A-14C are illustrations of a configuration of the liquid cooling system that provides electrical isolation. In this configuration, the metal enclosure of the system serves as an effective radiation, Electromagnetic Interference (EMI) and Radio Frequency Interference (RFI) shield. In environments where high-performance electronic components operate, electromagnetic noise generated internally or received from external sources can significantly affect the performance and reliability of sensitive circuits. EMI and RFI are common issues in modern electronic systems, particularly those operating in high-density environments, such as data centers, telecommunications systems, and industrial applications.

The metal enclosure in the system forms a natural Faraday cage around the enclosed components. A Faraday cage is a structure made from conductive materials that blocks electromagnetic fields by redistributing electrical charge around its exterior, thereby preventing the transmission of interference through the enclosure. In this configuration, the metal enclosure serves dual functions: it protects internal components from external electromagnetic interference and prevents any radiation/emissions generated within the system from affecting nearby sensitive devices.

The metal enclosure's continuous conductive surface and grounding points enable it to effectively mitigate EMI and RFI across a broad frequency spectrum. By containing both electric and magnetic interference, the enclosure ensures that electronic components function optimally in environments where signal integrity is critical. This shielding effect is particularly useful in applications where precision and low-noise operation are required, such as in telecommunication systems, medical devices, and aerospace electronics.

Furthermore, the synergistic integration of the system's thermal management and EMI/RFI shielding capabilities adds another layer of reliability to the overall system. While the metal enclosure ensures efficient heat dissipation through advanced surface treatments and structural design, it also concurrently maintains signal integrity and reduces the susceptibility of the enclosed components to external interference. This results in a highly robust system that not only performs well thermally but also meets stringent requirements for electromagnetic compatibility (EMC).

By incorporating EMI/RFI shielding as a feature of the system, the enclosed liquid cooling system provides a comprehensive solution that improves both the thermal and electrical reliability of high-performance electronic devices. This dual functionality further reinforces the benefits of the system across a wide range of industries where both heat management and electromagnetic shielding are paramount considerations.

For shielding, the enclosure is coupled to ground. The coupling may be along the interior edges of the enclosure. In various embodiments, the ground plane of the PCB may be used for this coupling. The grounding uses aluminum (or other metallic) fingers 1410 along the inside edge of the enclosure, in various embodiments. These metallic fingers are mated with copper traces on the PCB to provide shielding for the electronics inside the chamber.

In various embodiments an exposed trace 1435 on the PCB 1430 following the inner silkscreen is used. The trace 1435 is stitched with frequently spaced stitching vias 1445 between a top ground trace and a bottom ground trace, such that it forms an additional shielding of the electronics inside the chamber against radiation, EMI, RFI and electrostatic discharge (ESD) pulses. These features also reduce the electromagnetic noise leaking from within the PCB dielectric. This enables the use of components with the chamber in sensitive environments, in locations where radiation leakage would be problematic, as well as in high radiation environments.

Figure 15:
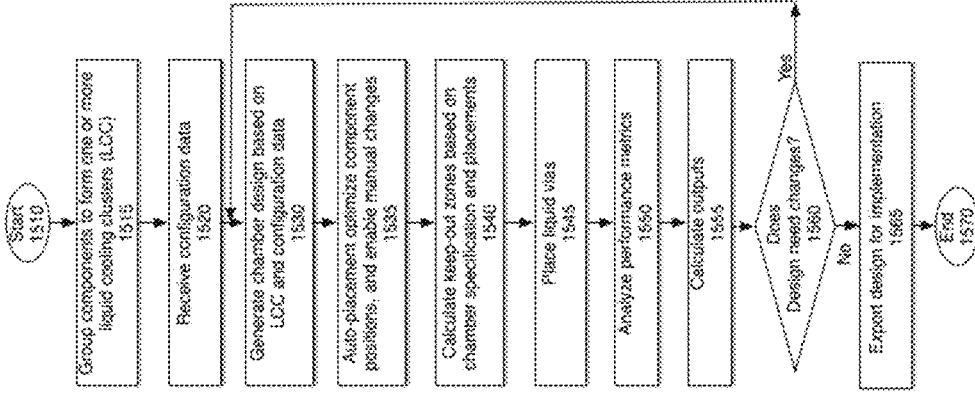
FIG. 15 is a flowchart of using an electronic design automation (EDA) tool for designing the liquid cooling system.

FIG. 15 is a flowchart of using an electronic design automation (EDA) tool for designing the liquid cooling system. Incorporating enclosed liquid cooling technology into electronic products can significantly enhance their thermal management capabilities. The use of advanced Electronic Design Automation (EDA) tools allows designers to seamlessly integrate enclosed liquid cooling features into their designs, simulate thermal performance, and optimize production. FIG. 15 provides a typical workflow for this design. The process starts at block 1510. The typical PCB design process begins after the completion of schematic diagrams, with parts being exported to design software. The software imports all components, initially placing them in rows and columns outside the PCB board outline. Designers then define the PCB outline and begin placing components in the desired layout. EDA tools often include auto-placement features that optimize component arrangement for routing efficiency, taking into account clocking/interference/heat dissipation. Adding the integrated enclosed liquid cooling design functionality can provide auto-placement preferences based on positioning of the enclosure for heat dissipation & the sizes and positions of the liquid flow-holes. This process starts after the initial layout of the circuit components on the PCB.

At block 1515, components are grouped in the schematic design package to form one or more clusters that will be covered by an enclosure. A cluster is referred to as Liquid Cooling Cluster (LCC). This may be done by designers, or automatically based on the identification of components, and their expected heat dissipation needs. In the PCB design software, these groups are selected and assigned to an LCC, allowing for configuration and optimization. In various embodiments, a single printed circuit board may include multiple LCCs.

At block 1520, specific configuration data is received for each LCC, which may include one or more of: enclosure placement, chamber dimensions, gasket options, geometry preferences, positioning of mounting holes, positions and sizes of liquid flow-holes, and shielding. The configuration data may be entered by a designer. Some of the configuration data may be automatically generated based on expected usage configuration data. For example, the usage configuration data may include the chips within the chamber, the expected heat generated, the expected position of the final product, and the use case. The system may then generate the chamber configuration data based on the usage configuration data. For example, the volume of the chamber may be selected based on the configuration of the components and the cooling needs of the components. The amount of liquid in the system and thus the size of the enclosure is selected depending on the cooling needs of the components.

Enclosure Placement defines the options for placing the liquid cooling chamber on the top, bottom, or both sides of the PCB. Enclosure Dimensions define the maximum height, material thickness, and geometric cooling features (e.g., ribs, studs). The gasket options allow selection from standard gasket sizes or customization based on design requirements. The geometry preferences for the enclosure allow a choice of rectangle, square, number of corners, and symmetry requirements for cost efficiency in mass production. The mounting holes specify the number, spacing, and positioning of mounting holes for stability. The liquid flow-holes specify the number, placement, and dimensions of the flow-holes. The liquid flow-holes can also specify plating and power plane attachments for thermal conduction pathways. The optional EMI/RFI Shielding provides specifications for stitching vias around the enclosure perimeter, including spacing and plane attachment.

At block 1530, the enclosure design is created, based on the LCC and configuration data. Designers may manually draw the chamber outline or use an automatic feature to ensure the chamber encloses all selected components.

At block 1535, auto-placement tools optimize component positions and sides for connectivity and height restrictions. Once components are placed, designers can make manual adjustments and corrections.

At block 1540, the LC module calculates keep-out zones based on chamber specifications, preventing interference with seals and ensuring leak-free operation. This data is provided to the EDA tool, for use in the routing and clock design.

After routing, at block 1545, the liquid flow-holes are placed. The liquid flow-holes may be placed in any of the above discussed positions, on the PCB outside the component area, underneath components (inter-chip) as well as through component packaging (intra-chip), as needed.

At block 1550, the system analyzes the performance metrics of the LCC based on a simulation. Simulation parameters may include chamber specifications (thickness, material type, coating, and texture, expected environmental conditions (ambient temperature, airflow, and external influences), component power profiles (power consumption curves and thermal energy production at various temperatures), transfer liquid properties (density, heat capacity, and type of transfer liquid used).

At block 1555, the tool optionally calculates outputs such as steady-state temperatures, heat rise curves, chamber volume and weight, and detailed geometry. The designer may then tweak specifics and iterate if needed, at block 1560.

Once the design is complete, the final design is exported at block 1565. The final design may be in formats like STL, STEP, GES, or CNC-compatible G-CODE for manufacturing. The process then ends at block 1570.

Using EDA tools for enclosed liquid cooling system design and simulation offers numerous advantages, including efficiency, optimization, robustness, cost savings, performance, and integration into an existing workflow.

Rapid prototyping and iteration of designs with real-time feedback provide increased efficiency. The ability to test various configurations and parameters to achieve optimal thermal performance provides optimization. Enhanced reliability and durability of electronic products through improved thermal management increases robustness. Reduced development time and improved manufacturability, lead to lower production costs. Increased energy efficiency and extended lifespan of electronic components due to effective heat dissipation increases performance. By leveraging EDA tools, designers can integrate enclosed liquid cooling technology into their products more effectively, ensuring that electronic devices meet the demanding thermal requirements of modern applications.

As described above, the enclosed liquid cooling system utilizes a leak-proof chamber and one or more types of liquid flow-holes to allow the use of a transfer liquid to more efficiently transfer heat from one or more components. This has many uses and advantages and can be used to improve critical metrics for computing systems.

The demand for increased computational efficiency and density has grown in parallel with advancements in semiconductor technology. Two critical metrics—compute/watt efficiency and compute density—serve as key performance indicators (KPIs) in the evaluation of computing systems, particularly in applications where energy consumption, space constraints, and operational costs are paramount considerations. As silicon-based systems evolve, the power density challenge has emerged as a crucial factor influencing both of these KPIs, requiring more sophisticated thermal management solutions.

Compute/watt efficiency refers to the amount of computational work a system can perform per watt of power consumed, typically measured in Floating Point Operations per Second (FLOPS) per watt. This metric is essential in various contexts, including:

Energy Management: As power consumption continues to be a significant cost driver in data centers and high-performance computing environments, systems exhibiting high Compute/Watt Efficiency result in reduced energy expenditure for a given computational workload.

Environmental Impact: Reducing power consumption in computing systems directly mitigates the carbon footprint associated with data centers and other energy-intensive operations, contributing to global sustainability efforts.

Thermal Management: Efficient use of power translates into reduced thermal output, minimizing the need for extensive cooling infrastructure and increasing the operational lifespan of equipment by reducing thermal stress.

Battery Usage: In portable or remote computing systems reliant on battery power, maximizing Compute/Watt Efficiency is critical for extending operational lifetimes while maintaining performance.

Compute density measures the computational power available in a given physical space, often expressed as FLOPS per cubic meter or per rack unit in data centers. This KPI is particularly important in environments where space is limited or costly. Compute density is used for improving:

Space Optimization: High Compute Density is vital in facilities with constrained physical space, such as edge computing nodes or urban data centers, enabling greater computational power in smaller footprints.

Cost Efficiency: Increasing Compute Density reduces the need for additional physical infrastructure, such as expanded data center space or cooling systems, thereby decreasing both capital and operational expenditures.

Scalability: Systems with higher Compute Density allow for more scalable computational growth without a proportional increase in physical space requirements, enabling efficient capacity planning.

Performance Maximization: Optimizing space usage for computing resources enables organizations to deploy more powerful, higher-performance systems, leading to enhanced computational throughput and efficiency.

As semiconductor manufacturing processes advance, transistors and other components are increasingly packed more densely onto silicon dies, leading to a corresponding increase in power density. This results in several challenges:

Heat Generation: As power density increases, the heat generated within smaller surface areas rises, making effective heat dissipation more challenging.

Thermal Management Complexity: Effective management of the thermal load from high-density silicon dies necessitates advanced cooling solutions to prevent thermal throttling, reduced system efficiency, and potential hardware failure.

This challenge is a critical consideration across various use cases, as it directly impacts both compute/watt efficiency and compute density. For example, in data centers, high-density silicon designs lead to increased heat output, requiring sophisticated cooling solutions to maintain efficiency. The power density challenge underscores the need for improved thermal management to avoid energy waste in cooling systems. Increasing Compute Density in data centers presents significant thermal management challenges due to the difficulty of dissipating heat from densely packed components. Advanced cooling techniques such as the enclosed liquid cooling system described in this application may be used to overcome these limitations.

Edge devices, often deployed in environments without dedicated cooling infrastructure, must efficiently manage heat to maintain operational efficiency. The power density challenge is especially acute for edge devices, as compact, high-density components generate significant heat in confined spaces. Additionally, in edge environments where physical space is limited, achieving high compute density requires compact, high-density silicon chips. The power density challenge of edge devices reinforces the need for improved passive or active cooling methods to prevent overheating, such as the enclosed liquid cooling system described herein.

AI workloads place high demands on GPUs and accelerators, which are subject to the power density challenge. Effective heat management of these high-density components is crucial to maintaining efficiency and avoiding thermal throttling. AI clusters require high compute density to support multiple graphical processing units (GPUs) within a single chassis or rack. To sustain high-density AI computations without compromising performance, advanced cooling technologies, such as the enclosed liquid cooling system described herein are necessary to mitigate the thermal impacts of the power density challenge.

Gaming systems utilize high-density silicon chips, particularly in GPUs and CPUs, where the power density challenge exacerbates the difficulties of heat dissipation. Customized cooling solutions are often employed to maintain efficiency and performance. As gaming systems push for higher power output in increasingly compact designs, the power density challenge requires effective thermal management to ensure high performance without overheating, such as the enclosed liquid cooling system.

In automotive and aerospace systems, compact, high-density silicon designs must operate in harsh environments where the power density challenge is critical. Effective thermal management is essential for maintaining system reliability and performance. Aerospace applications, in particular, require lightweight, compact systems where space and weight are limited. Innovative cooling solutions, such as the enclosed liquid cooling system are needed to address the power density challenge and maintain high compute density in mission-critical environments.

Thus, the power density challenge is an increasingly prominent issue in a wide variety of fields, as silicon dies become denser, components shrink, and more computationally intensive processes are used. This challenge affects compute/watt efficiency and compute density across various industries, including data centers, edge computing, AI workloads, gaming systems, and automotive and aerospace applications. By addressing the thermal management challenges posed by high-density silicon designs utilizing the enclosed liquid cooling system described above, organizations can optimize system performance, reduce energy consumption, and prevent the detrimental effects of overheating.

Figure 16:
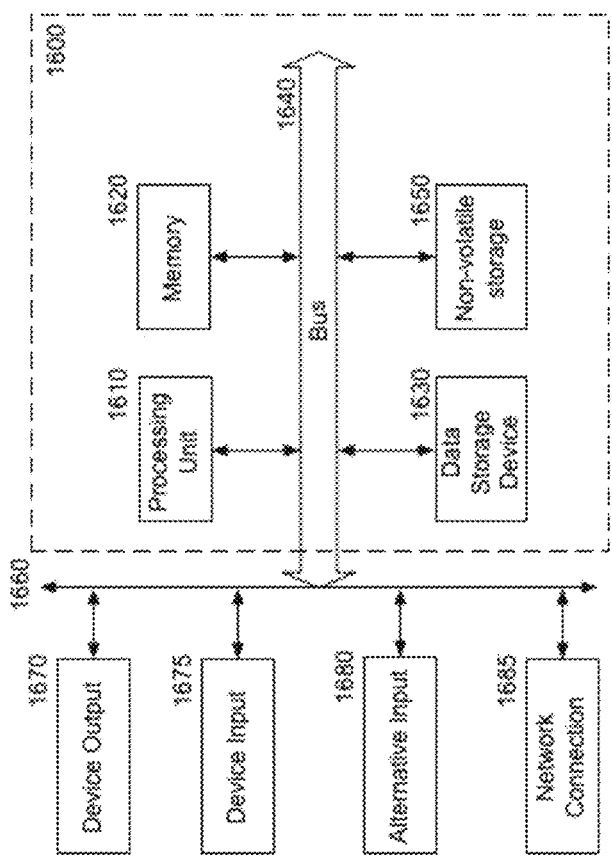
FIG. 16 is a block diagram of a computer system that may be used with the present system.

FIG. 16 is a block diagram of a particular machine that may be used with the present invention. The computing system described may be used to provide the electronic design automation (EDA) tool, described above. Furthermore, the enclosed liquid cooling system may be used in such a computing system for cooling one or more components. It will be apparent to those of ordinary skill in the art, however that other alternative systems of various system architectures may also be used.

The data processing system illustrated in FIG. 16 includes a bus or other internal communication means 1640 for communicating information, and a processing unit 1610 coupled to the bus 1640 for processing information. The processing unit 1610 may be a central processing unit (CPU), a digital signal processor (DSP), or another type of processing unit 1610. Additionally, or alternatively, the system may include a graphical processing unit (GPU) or other processing systems.

The system can further include a random access memory (RAM) or other volatile storage device 1620 (referred to as memory), coupled to bus 1640 for storing information and instructions to be executed by processor 1610. Main memory 1620 may also be used for storing temporary variables or other intermediate information during execution of instructions by processing unit 1610.

The system can also include a read only memory (ROM) 1650 and/or static storage device 1650 coupled to bus 1640 for storing static information and instructions for processor 1610. The system also can include a data storage device 1630 such as a magnetic disk or optical disk and its corresponding disk drive, or Flash memory or other storage which is capable of storing data when no power is supplied to the system. Data storage device 1630 is coupled to bus 1640 for storing information and instructions.

The system may further be coupled to an output device 1670, such as a cathode ray tube (CRT) or a liquid crystal display (LCD) coupled to bus 1640 through bus 1660 for outputting information. The output device 1670 may be a visual output device, an audio output device, and/or tactile output device (e.g. vibrations, etc.)

An input device 1675 may be coupled to the bus 1660. The input device 1675 may be an alphanumeric input device, such as a keyboard including alphanumeric and other keys, for enabling a user to communicate information and command selections to processing unit 1610. An additional user input device 1680 may further be included. One such user input device 1680 is cursor control device 1680, such as a mouse, a trackball, stylus, cursor direction keys, or touch screen, may be coupled to bus 1640 through bus 1660 for communicating direction information and command selections to processing unit 1610, and for controlling movement on display device 1670.

Another device, which may optionally be coupled to computer system 1600, is a network device 1685 for accessing other nodes of a distributed system via a network. The communication device 1685 may include any of a number of commercially available networking peripheral devices such as those used for coupling to an Ethernet, token ring, Internet, or wide area network, personal area network, wireless network or other method of accessing other devices. The communication device 1685 may further be a null-modem connection, or any other mechanism that provides connectivity between the computer system 1600 and the outside world.

Note that any or all of the components of this system illustrated in FIG. 16 and associated hardware may be used in various embodiments of the present invention.

It will be appreciated by those of ordinary skill in the art that the particular machine that embodies the present invention may be configured in various ways according to the particular implementation. The control logic or software implementing the present invention can be stored in main memory 1620, mass storage device 1630, or other storage medium locally or remotely accessible to processor 1610.

It will be apparent to those of ordinary skill in the art that the design process described herein can be implemented as software stored in main memory 1620 or read only memory 1650 and executed by processor 1610. This control logic or software may also be resident on an article of manufacture comprising a computer readable medium having computer readable program code embodied therein and being readable by the mass storage device 1630 and for causing the processor 1610 to operate in accordance with the methods and teachings herein.

The computing system may also be configured as a handheld or portable device containing a subset of the computer hardware components described above. For example, the handheld device may be configured to contain only the bus 1640, the processor 1610, and memory 1650 and/or 1620. The handheld device may be configured to include a set of buttons or input signaling components with which a user may select from a set of available options. These could be considered input device #1 1675 or input device #2 1680. The handheld device may also be configured to include an output device 1670 such as a liquid crystal display (LCD) or display element matrix for displaying information to a user of the handheld device. Conventional methods may be used to implement such a handheld device. The implementation of the present invention for such a device would be apparent to one of ordinary skill in the art given the disclosure of the present invention as provided herein.

The present invention may also be embodied in a special purpose appliance including a subset of the computer hardware components described above. For example, the appliance may include a processing unit 1610, a data storage device 1630, a bus 1640, and memory 1620, and no input/output mechanisms, or only rudimentary communications mechanisms, such as a small touchscreen that permits the user to communicate in a basic manner with the device. In general, the more special purpose the device is, the fewer of the elements need be present for the device to function. In some devices, communications with the user may be through a touch-based screen, or similar mechanism. In various embodiments, the device may not provide any direct input/output signals but may be configured and accessed through a website or other network-based connection through network device 1685.

It will be appreciated by those of ordinary skill in the art that any configuration of the particular machine implemented as the computer system may be used according to the particular implementation. The control logic or software can be stored on any machine-readable medium locally or remotely accessible to processor 1610. A machine-readable medium includes any mechanism for storing information in a form readable by a machine (e.g. a computer). For example, a machine readable medium includes read-only memory (ROM), random access memory (RAM), magnetic disk storage media, optical storage media, flash memory devices, or other storage media which may be used for temporary or permanent data storage. The control logic may be implemented as transmittable data, such as electrical, optical, acoustical or other forms of propagated signals (e.g. carrier waves, infrared signals, digital signals, etc.).

The claims define the matter for protection.

Additionally, aspects of this specification provide the following.

A liquid cooling system comprising:

a printed circuit board (130, 240);

a gasket (115, 230) seated on a top side of the printed circuit board (130, 240), the gasket encircling one or more components (105) mounted on the printed circuit board (130, 240);

an enclosure (220, 260, 810) seated on the gasket and fastened against the printed circuit board to form a sealed chamber with the printed circuit board (130, 240) and the gasket (115, 230);

a transfer liquid (838) within the sealed chamber and contacting the one or more components (105) mounted on the printed circuit board (130, 240).

The liquid cooling system wherein the enclosure comprises:

a first component (220) on the top side of the printed circuit board, the first side seated on the gasket; and a second component (260) on a bottom side of the printed circuit board, the second side seated on a second gasket.

The liquid cooling system further comprising:

one or more liquid flow-holes (110, 840, 935) in the printed circuit board dimensioned to enable circulation of the transfer liquid between the top side and the bottom side of the printed circuit board.

The liquid cooling system wherein there are one or more additional components on the printed circuit board outside the enclosure.

The liquid cooling system wherein the one or more additional components include input/output (I/O) components.

The liquid cooling system further comprising:

the enclosure comprising a first compartment (520) and a second compartment (525), the first compartment surrounded by the gasket to provide the sealed enclosure, and the second compartment not being leakproof.

The liquid cooling system wherein the transfer liquid comprises a two-phase liquid and is in both liquid and gas phases in the chamber.

The liquid cooling system wherein the transfer liquid comprises one or more of: perfluorinated compounds (PFCs) and perfluorocarbons.

The liquid cooling system further comprising:

a silkscreened pattern (350, 360) on the printed circuit board for positioning the gasket;

wherein the gasket (315) is placed on the silkscreened pattern, with the silkscreened pattern provides positioning and sealing for the gasket, or wherein the silkscreened pattern is on one or both lateral sides of the gasket and the gasket contacts the printed circuit board without the silkscreened pattern being located between the gasket and the printed circuit board.

The liquid cooling system wherein the component comprises an integrated circuit having a component package and contacts, the system further comprising: inter-chip liquid flow-holes (935) in the printed circuit board under the integrated circuit to allow the transfer liquid to pass through the printed circuit board to a volume under the integrated circuit.

The liquid cooling system wherein the component comprises an integrated circuit having a die within a component package and contacts, the system further comprising:

an enclosed liquid through-hole in the component package configured to allow the transfer liquid to pass through the component package and remove heat from the die.

The liquid cooling system further comprising:

an intra-chip liquid through-hole that enters a packaging of one or more of the components on the printed circuit board.

The liquid cooling system wherein the intra-chip liquid through-hole is through one or more of: an integrated circuit substrate and an integrated circuit overmold.

The liquid cooling system wherein a first portion of the intra-chip liquid through-hole that passes through an integrated circuit substrate is plated.

The liquid cooling system wherein a second portion of the intra-chip liquid through hole that passes through the overmold is not plated.

The liquid cooling system of claim 10, wherein the transfer liquid replaces one or more thermal ground connections of the integrated circuit.

The liquid cooling system further comprising:

an active liquid driver configured to promote movement of the transfer liquid within the enclosure;

wherein the liquid driver is optionally one or more of: an integrated micropump within the enclosure configured to actively circulate the transfer liquid, a vibration motor within the enclosure to create mechanical agitation, a small submerged fan or propeller, a thermoelectric cooler (TEC) within the enclosure to create a temperature gradient, promoting fluid movement through thermal cycling, a speaker to generate acoustic waves, and a piezoelectric buzzer to create ultrasonic vibrations, promoting the movement of the transfer liquid.

The liquid cooling system further comprising a control mechanism to adjust speed and direction of the motor, thereby controlling the flow rate and pattern of the transfer liquid.

The liquid cooling system wherein the active liquid driver is mounted on the printed circuit board and positioned to direct the transfer liquid across a subset of components with a highest heat output.

The liquid cooling system further comprising:

a sensor to monitor the temperature of the transfer liquid, coupled with a feedback system to adjust the speed of the liquid driver for optimal cooling performance.

The liquid cooling system wherein at least one of the one or more components comprises a chiplet with a plurality of dies in a single package.

The liquid cooling system further comprising an electronic design automation (EDA) tool integration to enable design of the liquid cooling system, the EDA tool to lay out the one or more components on the printed circuit board, the EDA tool further comprising:

a user interface to enable a user to define a cluster of the one or more components to encompass within the enclosure;

an automatic positioning tool to design the enclosure, based on characteristics and positioning of the one or more components.

The liquid cooling system wherein the automatic positioning tool designing the enclosure is further to calculate a volume, weight, and geometry for the enclosure.

The liquid cooling system wherein the automatic positioning tool is further to identify the gasket specifications for the enclosure.

The liquid cooling system further comprising:

a motor with a propeller attached to a shaft designed to generate liquid flow within the enclosure, thereby enhancing the distribution of heat from the one or more components.

A method of using an enclosed liquid cooling system comprising:

placing a gasket on a printed circuit board, encircling a portion of the printed circuit board;

seating the enclosure over the gasket and fastening the enclosure against the printed circuit board to form a chamber between the printed circuit board, the gasket and the enclosure forming a sealed chamber; and filling the chamber with a transfer liquid.

The method further comprising:

placing a plurality of liquid flow-holes in the printed circuit board, such that the transfer liquid can flow between a bottom portion of the enclosure on a bottom of the printed circuit board and a top portion of the enclosure on a top of the printed circuit board through the liquid flow-holes, wherein optionally the liquid flow-holes are inter-chip liquid flow-holes underneath a circuit on the printed circuit board.

In the foregoing specification, the invention has been described with reference to specific exemplary configurations thereof. It will, however, be evident that various modifications and changes may be made thereto without departing from the broader spirit and scope of the invention as set forth in the appended claims. Furthermore, the various examples and configurations are generally designed to be mixed and matched, unless they are mutually exclusive. The specification and drawings are, accordingly, to be regarded in an illustrative rather than a restrictive sense.

What is claimed is:

1. A liquid cooling system comprising:
a printed circuit board;
a gasket seated on a top side of the printed circuit board, the gasket encircling one or more components mounted on the printed circuit board;
a silkscreened pattern printed on the printed circuit board for positioning the gasket;
wherein the gasket is placed on the silkscreened pattern, with the silkscreened pattern used for positioning the gasket and the gasket is sealed against the silkscreened pattern;
an enclosure seated on the gasket and fastened against the printed circuit board to form a sealed chamber with the printed circuit board and the gasket;
a transfer liquid within the sealed chamber and contacting the one or more components mounted on the printed circuit board.

2. The liquid cooling system of claim 1, wherein the enclosure comprises:
a first component on the top side of the printed circuit board, the first component seated on the gasket; and
a second component on a bottom side of the printed circuit board, the second component seated on a second gasket.

3. The liquid cooling system of claim 2, further comprising:
one or more liquid flow-holes in the printed circuit board dimensioned to enable circulation of the transfer liquid between the top side and the bottom side of the printed circuit board.

4. The liquid cooling system of claim 1, wherein there are one or more additional components on the printed circuit board outside the enclosure.

5. The liquid cooling system of claim 4, wherein the one or more additional components include input/output (I/O) components.

6. The liquid cooling system of claim 1, further comprising:
the enclosure comprising a first compartment and a second compartment, the first compartment surrounded by the gasket to provide the sealed enclosure, and the second compartment not being leakproof.

7. The liquid cooling system of claim 1, wherein the transfer liquid comprises a two-phase liquid and is in both liquid and gas phases in the chamber.

8. The liquid cooling system of claim 1, further comprising:
a silkscreened pattern on the printed circuit board for positioning the gasket;
wherein the silkscreened pattern is on one or both lateral sides of the gasket and the gasket contacts the printed circuit board without the silkscreened pattern being located between the gasket and the printed circuit board.

9. The liquid cooling system of claim 1, wherein the component comprises an integrated circuit having a component package and contacts, the system further comprising:
inter-chip liquid flow-holes in the printed circuit board under the integrated circuit to allow the transfer liquid to pass through the printed circuit board to a volume under the integrated circuit.

10. The liquid cooling system of claim 1, wherein the component comprises an integrated circuit having a die within a component package and contacts, the system further comprising:
an enclosed liquid through-hole in the component package configured to allow the transfer liquid to pass through the component package and remove heat from the die.

11. The liquid cooling system of claim 1, further comprising:
an active liquid driver configured to promote movement of the transfer liquid within the enclosure;
wherein the liquid driver is one or more of: an integrated micropump within the enclosure configured to actively circulate the transfer liquid, a vibration motor within the enclosure to create mechanical agitation, a small submerged fan or propeller, a thermoelectric cooler (TEC) within the enclosure to create a temperature gradient, promoting fluid movement through thermal cycling, a speaker to generate acoustic waves, and a piezoelectric buzzer to create ultrasonic vibrations, promoting the movement of the transfer liquid.

12. The liquid cooling system of claim 11, further comprising:
a motor with a propeller attached to a shaft designed to generate liquid flow within the enclosure, thereby enhancing a distribution of heat from the one or more components.

13. A method of using an enclosed liquid cooling system comprising:
printing a silkscreened pattern on a printed circuit board;
placing a gasket on the printed circuit board, encircling a portion of the printed circuit board wherein the gasket is placed on the silkscreened pattern, with the silkscreened pattern providing positioning and the gasket sealed against the silkscreened pattern for sealing for the gasket;
seating an enclosure over the gasket and fastening the enclosure against the printed circuit board to form a chamber between the printed circuit board, the gasket and the enclosure forming a sealed chamber; and
filling the chamber with a transfer liquid.

14. The method of claim 13, further comprising:
placing a plurality of liquid flow-holes in the printed circuit board, such that the transfer liquid can flow between a bottom portion of the enclosure on a bottom of the printed circuit board and a top portion of the enclosure on a top of the printed circuit board through the liquid flow-holes.

15. The method of claim 13, wherein the enclosure has a first side and a second side, the method further comprising:
placing a first component on a top side of the printed circuit board, the first side seated on the gasket; and placing a second component on a bottom side of the printed circuit board, the second side seated on a second gasket.

16. The method of claim 13, wherein there are one or more additional components on the printed circuit board outside the enclosure.

17. The method of claim 13, wherein the transfer liquid comprises a two-phase liquid and is in both liquid and gas phases in the chamber.

18. The method of claim 13, further comprising:

placing an active liquid driver into the enclosure, the active liquid driver configured to promote movement of the transfer liquid within the enclosure;

wherein the liquid driver is one or more of: an integrated micropump within the enclosure configured to actively circulate the transfer liquid, a vibration motor within the enclosure to create mechanical agitation, a small submerged fan or propeller, a thermoelectric cooler (TEC) within the enclosure to create a temperature gradient, promoting fluid movement through thermal cycling, a speaker to generate acoustic waves, and a piezoelectric buzzer to create ultrasonic vibrations, promoting the movement of the transfer liquid.

19. The method of claim 14, wherein one or more of the plurality of liquid flow-holes are inter-chip liquid flow-holes underneath a component on the printed circuit board.

20. A liquid cooling system comprising:

a substrate including a plurality of components and a silkscreened pattern printed on the substrate for the liquid cooling system;

an enclosure placed on the silkscreened pattern on the substrate enclosing one or more of the plurality of components;

a gasket positioned on the silkscreened pattern between the substrate and the enclosure, with the silkscreened pattern providing positioning and sealing with the gasket for the enclosure, the enclosure thereby forming a leakproof chamber filled with a transfer fluid to cool the one or more of the plurality of components within the enclosure.

* * * * *